(12) United States Patent
Zhang et al.

(10) Patent No.: US 7,714,438 B2
(45) Date of Patent: May 11, 2010

(54) BISTABLE MOLECULAR MECHANICAL DEVICES WITH A BAND GAP CHANGE ACTIVATED BY AN ELECTRICAL FIELD FOR ELECTRONIC SWITCHING, GATING, AND MEMORY APPLICATIONS

(75) Inventors: Xiao-An Zhang, Sunnyvale, CA (US); R. Stanley Williams, Redwood City, CA (US); Kent D. Vincent, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1263 days.

(21) Appl. No.: 09/823,195

(22) Filed: Mar. 29, 2001

(65) Prior Publication Data

US 2002/0176276 A1  Nov. 28, 2002

Related U.S. Application Data

(63) Continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

(51) Int. Cl.
*H01L 51/40* (2006.01)
*H01L 29/40* (2006.01)

(52) U.S. Cl. .................. 257/741; 438/610; 438/99; 257/E51.023; 257/E51.024

(58) Field of Classification Search .............. 438/99, 438/610; 257/40, 14, 141, 741, E51.003, 257/E51.023, E51.024, E51.025, E51.027, 257/E51.035
See application file for complete search history.

(56) References Cited

U.S. PATENT DOCUMENTS 4,180,656 A  12/1979  Garner (Continued)

FOREIGN PATENT DOCUMENTS

JP  2728123 B  12/1997

(Continued)

OTHER PUBLICATIONS

C. Kergueris, et al. "Electron transport through a metal-molecule-metal junction", Physical Review B, vol. 59, No. 19, May 15, 1999, pp. 12505-12513.*

(Continued)

*Primary Examiner*—Caridad M Everhart

(57) ABSTRACT

Molecular systems are provided for electric field activated switches, such as a crossed-wire device or a pair of electrodes to which the molecular system is linked by linking moieties. The crossed-wire device comprises a pair of crossed wires that form a junction where one wire crosses another at an angle other than zero degrees and at least one connector species connecting the pair of crossed wires in the junction. The connector species comprises the molecular system, which has an electric field induced band gap change, and thus a change in its electrical conductivity, that occurs via one of the following mechanisms: (1) molecular conformation change; (2) change of extended conjugation via chemical bonding change to change the band gap; or (3) molecular folding or stretching. Nanometer-scale reversible electronic switches are thus provided that can be assembled easily to make cross-bar circuits, which provide memory, logic, and communication functions.

48 Claims, 3 Drawing Sheets

U.S. PATENT DOCUMENTS

| | | | | |
|---|---|---|---|---|
| 5,011,907 | A * | 4/1991 | Beratan | 528/220 |
| 5,589,692 | A * | 12/1996 | Reed | 257/23 |
| 6,031,756 | A * | 2/2000 | Gimzewski et al. | 365/151 |
| 6,128,214 | A | 10/2000 | Kuekes et al. | 365/151 |
| 6,198,655 | B1 * | 3/2001 | Heath et al. | 365/151 |
| 6,348,700 | B1 * | 2/2002 | Ellenbogen et al. | 257/40 |
| 6,628,016 | B2 * | 9/2003 | Michl et al. | 310/10 |
| 6,774,222 | B1 * | 8/2004 | Schneider et al. | 536/23.1 |
| 7,186,355 | B2 * | 3/2007 | Swager | 252/500 |
| 2001/0026360 | A1 * | 10/2001 | Baker et al. | 355/77 |
| 2002/0158244 | A1 * | 10/2002 | Schlag | 257/40 |
| 2003/0112564 | A1 * | 6/2003 | Granstrom | 360/324.12 |
| 2004/0190429 | A1 * | 9/2004 | McCreery | 369/126 |

FOREIGN PATENT DOCUMENTS

| | | |
|---|---|---|
| JP | 11-509271 A | 8/1999 |
| WO | 9835271 A1 | 8/1998 |
| WO | WO9835271 | 8/1998 |
| WO | WO02089229 | 11/2002 |
| WO | WO03016992 | 2/2003 |

OTHER PUBLICATIONS

C. Zhou, et al. "Nanoscale metal / self-assembled monolayer/metal heterostructues", App. Phys. Lett., vol. 71, No. 5, Aug. 4, 1997, pp. 611-613.*

IBM Technical Disclosure NN8902444 Molecular Electronic Circuit Device vol. 31, No. 9, pp. 444-450.*

Hush, et al "Electron and Energy Transfer through Bridged Systems" J. Am. Chem. Soc. 1990 vol. 112, pp. 4192-4197.*

Farazdel, et al. "Electric Field Induced Tntramolecular Electron Transfe"r J. Am Chem. Soc. 1990 vol. 112 pp. 4206-4214.*

Aviram "Molecules for Memory" J. Am. Chem. Soc. 1988 vol. 110, pp. 5687-5692.*

"Molecular Electronic Circuit Device", IBM Technical Disclosure NN8902444, vol. 31, No. 9, (Feb. 1, 1989) pp. 444-450.*

U.S. Appl. No. 09/280,048 entitled"Chemically Synthesized and Assembled Electronic Devices", filed on Mar. 29, 1999.

U.S. Appl. No. 09/280,225 entitled "Molecular Wire Crossbar Interconnects for Signal Routing and Communications", filed on Mar. 29, 1999.

U.S. Appl. No. 09/282,045 entitled "Molecular Wire Crossbar Logic", filed on Mar. 29, 1999.

U.S. Appl. No. 09/282,049 entitled "Demultiplexer for a Molecular Wire Crossbar Network", filed on Mar. 29, 1999.

U.S. Appl. No. 09/280,188 entitled "Molecular Wire Transistors" filed on Mar. 29, 1999.

C.P. Collier et al, "Electronically Configurable Molecular-Based Logic Gates", Science, vol. 285, pp. 391-394 (Jul. 16, 1999).

C.P. Collier et al, "A [2]Catenane-Based Solid State Electronically Reconfigurable Switch", Science, vol. 289, pp. 1172-1175 (Aug. 18, 2000).

A.M. Morales et al, "A laser ablation method for the synthesis of crystalline semiconductor nanowires", Science, vol. 279, pp. 208-211 (Jan. 9, 1998).

J.R. Heath et al, "A liquid solution synthesis of single crystal germanium quantum wires", Chemical Physics Letters, vol. 208, pp. 263-268 (Jun. 11, 1993).

V.P. Menon et al, "Fabrication and Evaluation of Nano-electrode Ensembles", Analytical Chemisstry, vol. 67, pp. 1920-1928 (Jul. 1, 1995).

T. Vossmeyer et al, "Combinatorial approaches toward patterning nanocrystals", Journal of Applied Physics, vol. 84, pp. 3664-3670 (Oct. 1, 1998).

D.V. Leff et al, "Thermodynamic Control of Gold Nanocrystal Size: Experiment and Theory", The Journal of Physical Chemistry, vol. 99, pp. 7036-7041 (May 4, 1995).

J.D.L. Holloway et al, "Electron-transfer reactions of metallocenes: Influence of metal oxidation state on structure and reactivity", Journal of the American Chemical Society, vol. 101, pp. 2038-2044 (Apr. 11, 1979).

C.P. Collier et al, "Electronically Configurable Molecular-Based Logic Gates", Science, vol. 285, pp. 391-394 (Jul. 16, 1999).

Hutchinson K A et al: "Chiropticenses: Molecular Chiroptical Dipole Switches for Optical Data Storage" Proceedings of the SPIE, SPIE, Bellingham, VA, US vol. 3937, 2000 pp. 64-72 XP009005995.

Database CA 'Online Chemical Abstracts Services, Columbus, OH, US; Riesz, E: "Some new benzothiazole derivative sand comparison dyeing with such compounds" retrieved from STN XP-002243303.

Roth et al: "Molecular Rectifiers and Transistors based on PI-conjugated materials"Synthetic Metals, Elsevier Sequoia, Lausanne, Ch vol. 94 No. 1, 1998 pp. 105-110 XP001004861.

Ward M D: "Current Development in Molecular Switches" Chemistry and Industry. Chemistry and Industry Review, Chemical Society Letchworth, GB No. 16, Aug. 18, 1997 pp. 640-645 XP00659773.

Shimizu: "Molecular Switch and Memory for Organic Electronic Matherials" Sen' I Kobunshi Zaiyo Kenkyujo Kenkyu Hokoku-Bulletin of the Research Institute for Polymers and Textiles, Kogyogijutsuin. Sen'I Kobunshi Zaiyo Kenkyujo, Tsukuba, JP No. 141, 1984 pp. 21-40 XP0001145548.

Hutchinson K A et al: "Chiropticenses: Molecular chiroptical Dipole Switches for Optical Data Storage" Proceedings of the SPIE, SPIE, Bellingham, VA, US vol. 3937, 2000 pp. 64-72 XP009005995.

Database CA 'Online Chemical Abstracts Servies, Columbus, OH, US; Riesz, E: "Some new benzothiazole derivative sand comparison dyeing with such compounds" retrieved from STN XP-002243303, (1991).

Hutchison, Katherine A. et al., "Chiropticenes: molecular chiroptical dipole switches for optical data storage", Micro- and Nano-photonic Materials & Devices, vol. 3927, (2000 ) pp. 64-72.

Shimizu, "Molecular switch and memory for organic electronic materials", vol. 141, (1984) pp. 21-40.

* cited by examiner

US 7,714,438 B2

BISTABLE MOLECULAR MECHANICAL DEVICES WITH A BAND GAP CHANGE ACTIVATED BY AN ELECTRICAL FIELD FOR ELECTRONIC SWITCHING, GATING, AND MEMORY APPLICATIONS

CROSS-REFERENCE TO RELATED APPLICATIONS

The present application is a continuation-in-part application Ser. No. 09/759,438, filed Jan. 12, 2001, now U.S. Pat. No. 6,512,119 issued Jan. 28, 2003 which in turn is a continuation-in-part application Ser. No. 09/738,793, filed Dec. 14, 2000 now U.S. Pat. No. 6,663,797 issued Dec. 16, 2003.

The present application is also related to the following applications and patents: Ser. No. 09/282,048 ("Chemically Synthesized and Assembled Electronic Devices"), now U.S. Pat. No. 6,459,095 issued Oct. 1, 2002; Ser. No. 09/280,225 ("Molecular Wire Crossbar Interconnects for Signal Routing and Communications") now U.S. Pat. No. 6,314,019, issued Nov. 6, 2001; Ser. No. 09/282,045 ("Molecular Wire Cross-bar Logic"); Ser. No. 09/282,049 ("Demultiplexer for a Molecular Wire Cross-bar Network"), now U.S. Pat. No. 6,256,767, issued Jul. 3, 2001; and Ser. No. 09/280,188 ("Molecular Wire Transistors"), all filed on Mar. 29, 1999, and U.S. Pat. No. 6,128,214, issued on Oct. 3, 2000 ("Molecular Wire Crossbar Memory"). The '188 application was abandoned in favor of a divisional application (Ser. No. 09/699,269, filed on Oct. 26, 2000), which issued as U.S. Pat. No. 6,559,468 on May 6, 2003.

The present application is an improvement over the foregoing applications and patent in that it is directed to classes of molecules that provide switching from one state to a different state, characterized by a change in the electrical conductivity.

TECHNICAL FIELD

The present invention relates generally to electronic devices whose functional length scales are measured in nanometers, and, more particularly, to classes of molecules that provide electronic switching. Electronic devices both of micrometer and nanometer scale may be constructed in accordance with the teachings herein.

BACKGROUND ART

The area of molecular electronics is in its infancy. To date, there have been two convincing demonstrations of molecules as electronic switches published in the technical literature; see, C. P. Collier et al., Science, Vol. 285, pp. 391-394 (Jul. 16, 1999) and C. P. Collier et al., Science, Vol. 289, pp. 1172-1175 (Aug. 18, 2000), but there is a great deal of speculation and interest within the scientific community surrounding this topic. In the published work, a molecule called a rotaxane or a catenane was trapped between two metal electrodes and caused to switch from an ON state to an OFF state by the application of a positive bias across the molecule. The ON and OFF states differed in resistivity by about a factor of 100 and 5, respectively, for the rotaxane and catenane.

The primary problem with the rotaxane was that it is an irreversible switch. It can only be toggled once. Thus, it can be used in a programmable read-only memory (PROM), but not in a ROM-like device nor in a reconfigurable system, such as a defect-tolerant communications and logic network. In addition, the rotaxane requires an oxidation and/or reduction reaction to occur before the switch can be toggled. This requires the expenditure of a significant amount of energy to toggle the switch. In addition, the large and complex nature of rotaxanes and related compounds potentially makes the switching times of the molecules slow. The primary problems with the catenanes are small ON-to-OFF ratio and a slow switching time.

Thus, what is needed is a molecular system that avoids chemical oxidation and/or reduction, permits reasonably rapid switching from a first state to a second, is reversible to permit the fabrication of ROM-like devices, and can be used in a variety of electronic devices.

DISCLOSURE OF INVENTION

In accordance with the present invention, a molecular system is provided for nanometer-scale reversible electronic switches, specifically, electric field activated molecular switches. The molecular system has an electric field induced band gap change that occurs via one of the following mechanisms:

(1) molecular conformation change or an isomerization;

(2) change of extended conjugation via chemical bonding change to change the band gap; or (3) molecular folding or stretching.

Changing of extended conjugation via chemical bonding change to change the band gap may be accomplished in one of the following ways:

(a) charge separation or recombination accompanied by increasing or decreasing band localization; or (b) change of extended conjugation via charge separation or recombination and $\pi$-bond breaking or formation.

The present invention provides nanometer-scale reversible electronic switches that can be assembled easily to make cross-bar and other circuits. The cross-bar circuits have been described in the above-listed series of patent applications and issued patent. The circuits provide memory, logic and communications functions. One example of the electronic switches is the so-called crossed-wire device, which comprises a pair of crossed wires that form a junction where one wire crosses another at an angle other than zero degrees and at least one connector species connecting the pair of crossed wires in the junction. The junction has a functional dimension in nanometers or larger for multilayers. The connector species comprises the molecular system disclosed and claimed herein.

The present invention introduces several new types of switching mechanism: (1) an electric (E) field induced rotation of at least one rotatable section (rotor) of a molecule to change the band gap of the molecule; (2) E-field induced charge separation or re-combination of the molecule via chemical bonding change to change the band gap; (3) E-field induced band gap change via molecule folding or stretching. These devices are generically considered to be electric field devices, and are to be distinguished from earlier embodiments (described in the above-mentioned related patent applications and patent) that are directed to electrochemical devices.

Thus, the molecule is never oxidized nor reduced in the toggling of the switch. Also, the part of the molecule that moves is quite small, so the switching times are expected to be very fast. Also, the molecules are much simpler and thus easier and cheaper to make than the rotaxanes, catenanes, and related compounds.

The molecular system of the present invention is expected to find use in a variety of applications, including, but not limited to, memories, logic devices, multiplexers, demultiplexers, configurable interconnects for integrated circuits, field-programmable gate arrays (FGPAs), cross-bar switches, and communication devices, such as cellular phones, mobile appliances, and PDAs.

BRIEF DESCRIPTION OF THE DRAWINGS

FIG. 1b is a perspective elevational view, depicting the device shown in FIG. 1a;

BEST MODES FOR CARRYING OUT THE INVENTION

Definitions

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

Basic Information on Prior Art Crossed Wire Switches

Figure 1A:
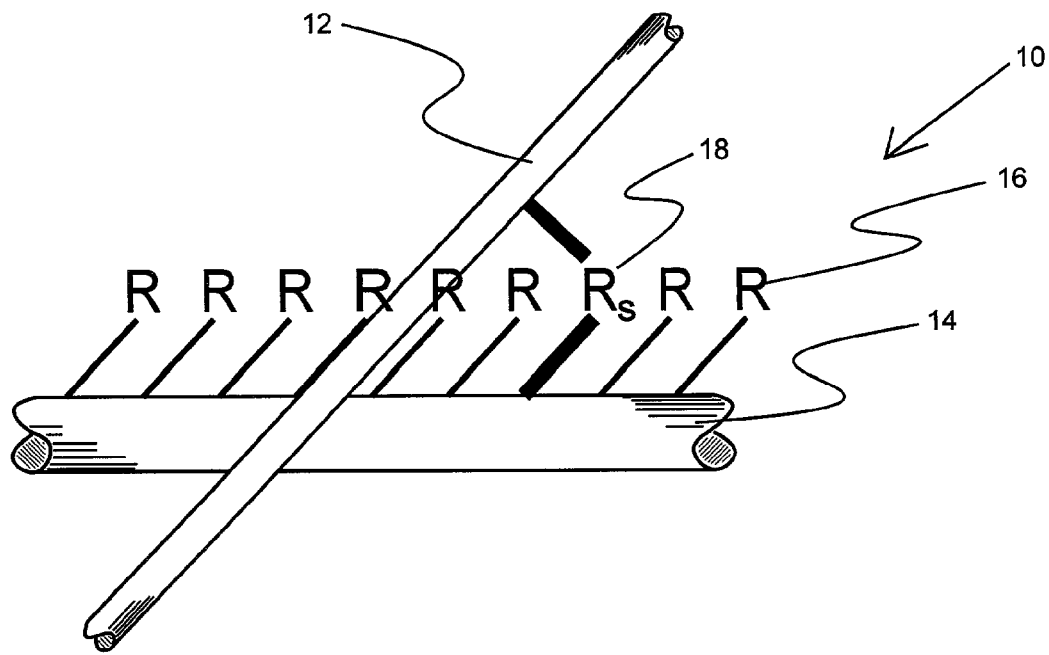
FIG. 1a is a schematic representation of two crossed wires, with at least one molecule at the intersection of the two wires.
Figure 1B:
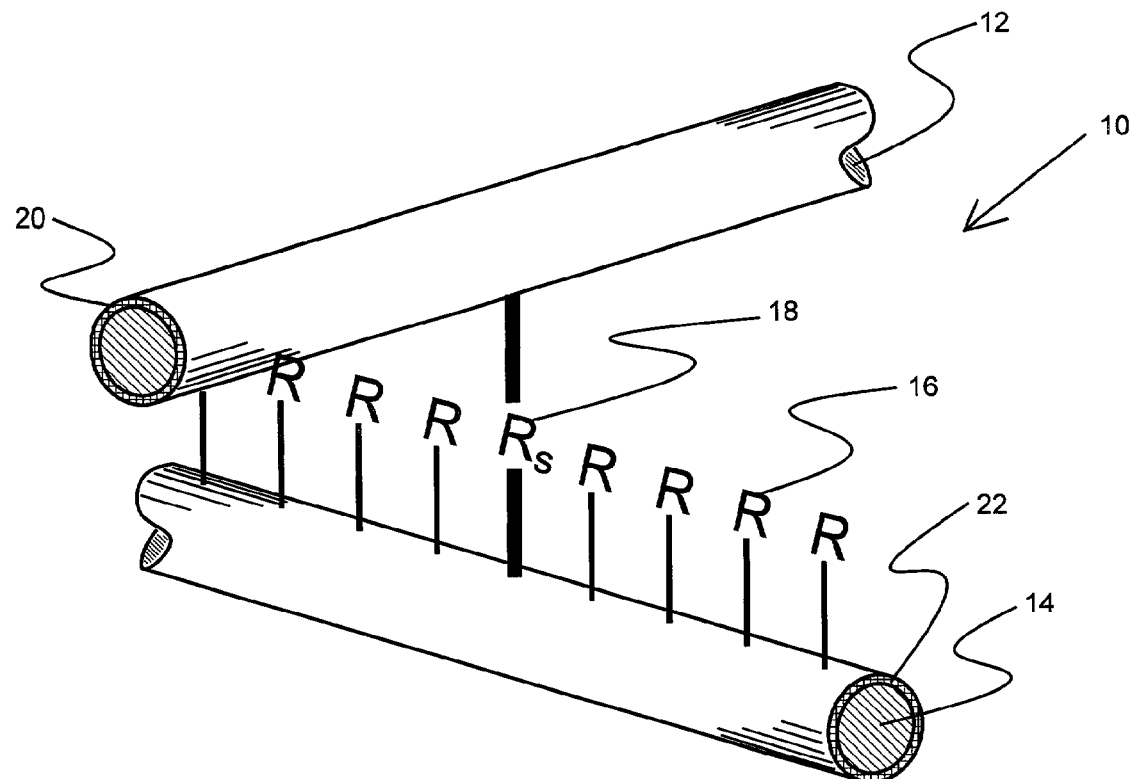

The essential device features are shown in FIGS. 1a-1b and are discussed in greater detail in the above-related patent applications and patent. A crossed wire switch 10 comprises two wires 12, 14, each either a metal or semiconductor wire, that are crossed at some non-zero angle. In between those wires is a layer of molecules or molecular compounds 16, denoted R in FIGS. 1a and 1b. The particular molecules 18 (denoted $R_s$) that are sandwiched at the intersection of the two wires 12, 14 are identified as switch molecules, also interchangeable referred to herein as a junction. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

The electrical tasks performed by these devices are largely determined by the types of wires (electrodes) and the inter-wire materials that are used. Table I presents the various types of devices that might be fabricated from various combinations of the wires 12, 14 in FIGS. 1a-1b.

TABLE I

Wire (Electrode) Materials

| Device Type | Metal-metal (same) | Metal-metal (different) | Metal-semi-conductor | Semiconductor-Semiconductor (p-n junction) | Semiconductor-semiconductor (hetero-junction) |
|---|---|---|---|---|---|
| Resistor | X | X | X | | |
| Tunneling resistor | X | X | X | | |
| Resonant tunneling resistor | X | X | X | | |
| Diode | | X | X | X | X |
| Tunneling diode | | X | X | X | X |
| Resonant tunneling diode | | X | X | X | X |
| Battery | | X | X | | X |

Depending on the molecules or materials that are used between the wires (the electrodes), each junction can either display the types of electrical function described below immediately on contact of the wires or the junction can have a switching function that acts to connect or disconnect the two wires together electrically. This switch can either be singly configurable or reconfigurable. In the first case, the initial state of the switch is open or closed. In the second case, by cycling the polarity and magnitude of the voltage on the switch beyond the appropriate threshold values, it is possible to reversibly oxidize or reduce the properly selected materials or molecules to close or open the switch many times. In either case, when closed, the type of electrical connection that is made between the wires depends upon the materials from which the wires (or electrodes) are fabricated as well as the identity of the molecules or materials between the wires.

Table I above shows a matrix of the various types of functions that can be obtained from various combinations of electrode materials and materials or molecules used in the junction. A resistor has a linear current-voltage characteristic, and is made by intentionally over-reducing the junction between various types of wires to essentially form a short circuit between the wires. The opposite of this process is to over-oxidize a junction, which will consume the wire in a localized region and effectively break the wire (create an open circuit) in that wire at the position of the junction. A tunneling resistor maintains a thin, approximately 2 nanometer thick, insulating barrier between wires and has an exponential current-voltage characteristic. In the case that junction molecules or materials have a sharply defined energy state inside the band gap of an electrically insulating barrier that can be accessed by electrically biasing the junction, the connection between the wires can exhibit a flow of electrical current that is dominated by the process of resonant tunneling. The resonant tunneling can produce one or more inflection points in the otherwise exponential current-voltage characteristic of a tunneling resistor. A diode is a junction that passes current more easily in one direction than in the other, and thus has an asymmetry in the current-voltage characteristic for positive and negative voltages. A tunneling diode has both the positive-negative voltage asymmetry of the diode and the exponential current-voltage characteristic of the tunneling resistor. A resonant tunneling diode has a positive-negative voltage asymmetry plus it has a peak in its current-voltage characteristic, such that over a restricted range of increasing magnitude of the voltage the magnitude of the current actually decreases, a phenomenon that is known as negative differential resistivity. In general, any real junction between wires formed by the processes described above will actually have two or more of the electrical functions described, with the effective circuit elements connected in series.

Thus, the present invention may be executed with any number of metallic or semiconducting wire/molecule combinations, depending on the device properties desired from the assembled circuit.

Basic Information on Prior Art Fabrication of Wire Electrodes

Process-Defined Wires (defined as wires that are prepared by conventional electronic-circuit processing techniques; wires are typically prepared on a substrate as part of a circuit):

Metallic and semiconductor wires, with diameters ranging from several micrometers to a single micrometer (defined as micrometer-scale), or with diameters ranging from a single micrometer down to 40 nanometers (defined as sub-micrometer scale) in diameter, may be prepared using well-established art, including lithographic (optical, ultraviolet, or electron beam) technologies. These wires normally have a ribbon shape or rectangular cross section, although circular cross sections are not precluded, with the width of the wire being determined by the lithographic process used to define the wire and its height being defined by the amount of material deposited in the region defined by lithography.

Chemically-Prepared Wires (these wires are prepared by techniques other than conventional electronic processing technology; wires are typically prepared as a bulk material, rather than as part of a circuit board):

Metal and semiconductor nanowires are defined as wires with diameters below 50 nanometers (typically 2 to 20 nanometers), and with lengths in the range of 0.1 micrometers to 50 micrometers (typically 5 to 10 micrometers). These may be prepared chemically using any one of a number of techniques described in the references given below.

One example of a reported technique for the production of semiconductor nanowires of the semiconducting element germanium is to react germanium tetrachloride and phenyltrichlorogermanium with a dispersion of sodium metal in the solvent toluene, and at a temperature near 300° C. in a closed vessel, under an inert environment, for a period of several days. That preparation produces single-crystal germanium nanowires of diameters three to thirty nanometers, and of lengths from 0.5 to 10 micrometers.

A second example of a reported technique for the production of semiconductor nanowires of the semiconducting element silicon, is to laser vaporize a target containing elemental silicon and iron. The target is placed in a vacuum oven at 1300° C., and an inert gas is flowed through the oven during the vaporization process. This technique produces silicon wires that have diameters in the range of 20 to 30 nanometers, and lengths ranging from 1 to 20 micrometers.

One example of a reported technique for the production of metallic nanowires of the metallic element gold is to electro-chemically grow gold wires within the pores of an anodically etched aluminum oxide thin film. The aluminum oxide is dissolved in acidic solution, releasing the gold nanowires, which are then collected. Gold nanowires grown in this manner are characterized by diameters ranging from 20 to 30 nanometers, and lengths ranging from 0.5 to 5 micrometers.

Nanowires of various metallic and semiconducting materials may be prepared in a variety of fashions. Some of these devices will require doped semiconductor wires, such as doped Si.

For the case of Si wires, the wires can be doped when the wires are physically prepared. In this case, it is necessary to add the dopant into the reaction vessel as the wires are formed. For example, in the laser ablation/vacuum oven preparation technique described above, a small amount of dopant gas, such as phosphorus trihydride ($PH_3$) or arsenic trihydride ($AsH_3$) is added into the inert gas (argon, for example) that flows through the vacuum oven during the laser ablation/wire formation process.

Conversely, these wires can be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. See wire preparation routes listed below. FIG. 1b depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires to be suspended to form colloidal suspensions, as discussed below.

To dope the wires via modulation-doping, it is necessary to chemically functionalize the surface of the wires using organic or inorganic molecules that will covalently bind to the Si—O—H groups at the surface of the wires. When silicon nanowires are exposed to air, a thin surface layer (1 nm) of $SiO_2$ will naturally form, and at the $SiO_2$/air interface, the $SiO_2$ surface is terminated by Si—O—H bonds. Groups that will bind to or replace Si—O—H groups are not limited to but include R—Si$(CH_3)_x$$(OCH_{3-x})$, R—Si$(CH_3)_x$$(OCH_2CH_{3-x})$, R—Si$(CH_3)_x$$Cl_{3-x}$, and others. In this case, R represents an organic or inorganic moiety that can contain electron-withdrawing (a Lewis acid) or electron-donating groups (a Lewis base). This chemistry of binding molecules to a $SiO_2$ passivated silicon surface is well established. One published example reaction for binding molecules to the surface of $SiO_2$ passivated silicon is:

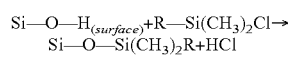

Other semiconductor wires can be functionalized with organo-amines, organo-thiols, organo-phosphates, etc.

Apparently, no previous description of how to modulation-dope chemically synthesized semiconductor wires has yet appeared in the technical literature.

For the case of other nanowires, such as metal nanowires, the wires can be chemically functionalized with R—SH (for gold or silver wires), or R—NH$_2$ (for platinum wires and palladium wires), or R—CO$_2$H for other metals such as Al$_2$O$_3$-coated aluminum wires or titanium wires), where the R-group denotes some organic moiety that will lend the wire certain chemical properties—such as the property that will allow the person skilled in the art to disperse the wires, as a colloid, in a solvent. In one example, gold wires might be functionalized with dodecanethiol (C$_{12}$H$_{25}$SH). The dodecanethiol not only will provide the wires with a thin surface tunneling barrier, but will also allow for the wires to be dispersed in simple organic solvents, such as hexane or chloroform.

Basic Information on Prior Art Wire Preparation Routes

The following materials may be prepared as nanowires according to the reference listed.

Silicon: A. M. Morales et al, "A laser ablation method for the synthesis of crystalline semiconductor nanowires", *Science*, Vol. 279, pp. 208-211 (Jan. 9, 1998).

Germanium: J. R. Heath et al, "A liquid solution synthesis of single crystal germanium quantum wires", *Chemical Physics Letters*, Vol. 208, pp. 263-268 (Jun. 11, 1993).

Metal Nanowires: V. P. Menon et al, "Fabrication and Evaluation of Nano-electrode Ensembles", *Analytical Chemistry*, Vol. 67, pp. 1920-1928 (Jul. 1, 1995).

Functionalizing Silicon: T. Vossmeyer et al, "Combinatorial approaches toward patterning nanocrystals", *Journal of Applied Physics*, Vol. 84, pp. 3664-3670 (Oct. 1, 1998) (one of a number of references).

Functionalizing the Surfaces of Gold Nanostructures: D. V. Leff et al, "Thermodynamic Size Control of Au Nanocrystals: Experiment and Theory", *The Journal of Physical Chemistry*, Vol. 99, p. 7036-7041 (May 4, 1995).

Molecular switching components may come from any number of different classes of molecules, depending, again, on the desired properties of the device. The key requirement of the molecules is that, when they are sandwiched between two wires, they may be electrochemically modified (i.e. oxidized or reduced) by applying a voltage across the wires. When the molecular components are so modified, the net effect is that the tunneling barrier between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other. An example of such a molecular redox pair might be: nickelocene (di-cyclopentadienyl nickel), or Cp$_2$Ni, with tetra-butylammonium hexafluorophosphate (Bu$_4$NPF$_6$). The reaction, then, would be:

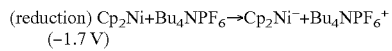
(reduction) Cp$_2$Ni+Bu$_4$NPF$_6$→Cp$_2$Ni$^-$+Bu$_4$NPF$_6^+$
(−1.7 V)

or

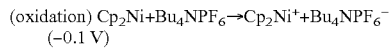
(oxidation) Cp$_2$Ni+Bu$_4$NPF$_6$→Cp$_2$Ni$^+$+Bu$_4$NPF$_6^-$
(−0.1 V)

The nickelocene system is of particular interest in that the reduction, as probed by solution phase cyclic voltammetry, is highly asymmetric. Such asymmetry is analogous to magnetization hysteresis curves that form the basis for stable and re-writeable magnetic memory. However, in the presence of oxygen, the reduction of nickelocene is irreversible, as probed by solution phase voltammetry. In either case, reduction or oxidation of this system will modify the tunneling barrier between the two wires between which the molecules are sandwiched. Thus, this system could operate as either a reconfigurable, or a singly configurable molecular switch. For metallocene systems, see, e.g., J. D. L. Holloway et al, "Electron-transfer reactions of metallocenes: Influence of metal oxidation state on structure and reactivity", *Journal of the American Chemical Society*, Vol. 101, pp. 2038-2044 (Apr. 11, 1979).

The connector species 16 comprises a material that displays a significant, or measurable, hysteresis in its current-voltage curve, obtained either from solution electrochemistry or from current-voltage characteristics in a solid-state junction. Examples of such species include metallocenes, rotaxanes, pseudo-rotaxanes, and catenanes, which rely on intramolecular hydrogen bonding. While such molecules are useful for the purpose disclosed, however, simple intramolecular hydrogen bonding forces are relatively easily exceeded under certain conditions, as discussed above.

Present Invention

The present invention introduces several new types of switching mechanisms that distinguish it from the prior art:

(1) an electric field ("E-field") induced rotation of at least one rotatable section (rotor) or a molecule to change the band gap of the molecule;

(2) E-field induced charge separation or recombination of the molecule via chemical bonding change to change the band gap; and (3) E-field induced band gap change via molecular folding or stretching.

Thus, the molecule is never oxidized nor reduced in the toggling of the switch, in contrast to prior art approaches. Also, the part of the molecule that moves is quite small, so the switching time is expected to be quite fast. Also, the molecules are much simpler and thus easier and cheaper to make than the rotaxanes, catenanes, and related compounds.

Figure 2:
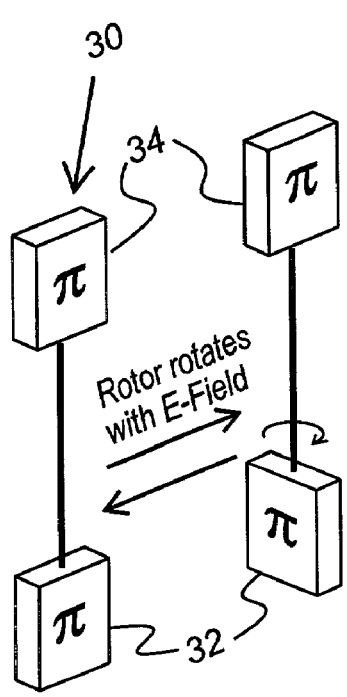
FIG. 2 is a schematic model depicting an E-field-induced band gap change via molecular conformation change (rotor/stator type of model)
Figure 3A:
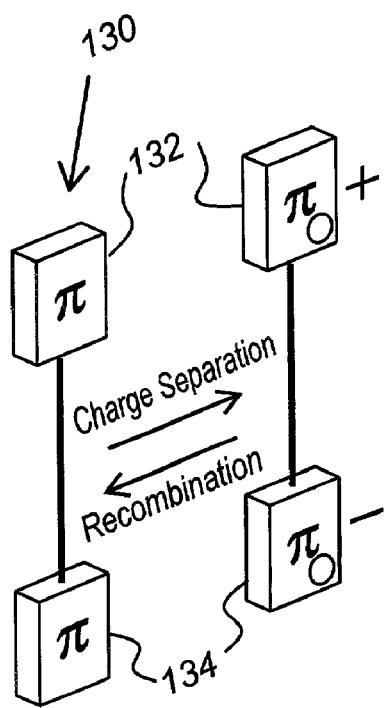
FIG. 3a is a schematic model depicting an E-field-induced band gap change caused by the change of extended conjugation via charge separation or recombination accompanied by increasing or decreasing band localization.
Figure 3B:
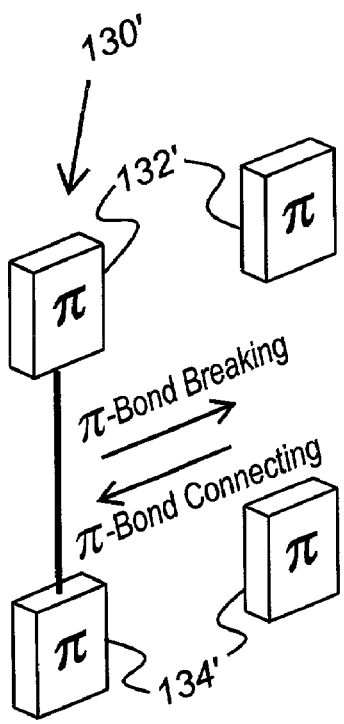
FIG. 3b is a schematic model depicting an E-field-induced band gap change caused by change of extended conjugation via charge separation or recombination and π-bond breaking or formation.
Figure 4:
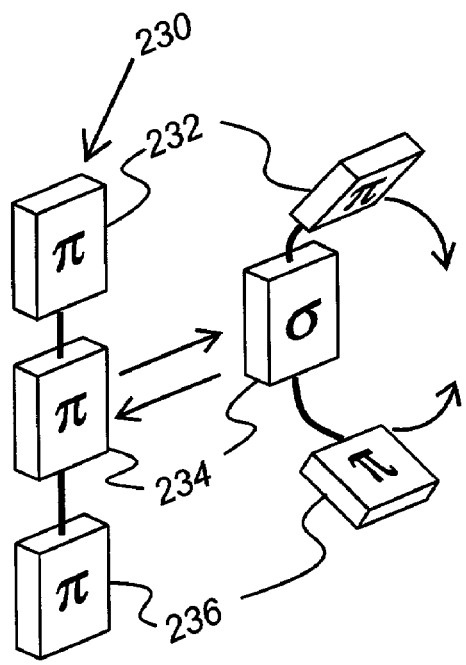
FIG. 4 is a schematic model depicting an E-field-induced band gap change via molecular folding or stretching.

The following are examples of model molecules with a brief description of their function:

(1) E-field induced band gap change via molecular conformation change (rotor/stator type of model)—FIG. 2;

(2a) E-field-induced band gap change caused by the change of extended conjugation via charge separation or recombination accompanied by increasing or decreasing band localization—FIG. 3a;

(2b) E-field-induced band gap change caused by change of extended conjugation via charge separation or recombination and π-bond breaking or formation—FIG. 3b; and (3) E-field-induced band gap change via molecule folding or stretching—FIG. 4.

Each model, with supporting examples, is discussed below. However, the examples given are not to be considered limiting the invention to the specific molecular systems illustrated, but rather merely exemplary of the above switching mechanisms.

Model (1): E-field-induced Band Gap Change Via Molecular Conformation Change (Rotor/Stator Type of Model):

FIG. 2 is a schematic depiction of this model, which involves an E-field-induced band gap change via molecular conformation change (rotor/stator type of model). As shown in FIG. 2, the molecule 30 comprises a rotor portion 32 and a stator portion 34. The rotor portion 32 rotates with an applied electric field. In one state, depicted on the left side of the drawing, there is an extended conjugation through the entire molecule, resulting in a relatively smaller band gap. In the other state, following rotation of the rotor, depicted on the right side of the drawing, the extended conjugation is destroyed, resulting in a relatively larger band gap.

The following requirements must be met in this model:
(a) The molecule must have at least one rotor and one stator segment;
(b) In one state of the molecule, there should be delocalized HOMOs and/or LUMOs (π-states and/or non-bonding orbitals) that extend over the entire molecule (rotor(s) and stator(s)), whereas in the other state, the orbitals are localized on the rotor and stator;
(c) The connecting unit between rotor and stator can be a single σ-bond or at least one atom with (1) non-bonding electrons (p or other electrons), or (2) π-electrons, or (3) π-electrons and non-bonding electron(s) to connect the rotor and stator with the σ-bond;
(d) The non-bonding electrons, or π-electrons, or π-electrons and non-bonding electron(s) of the rotor(s) and stator(s) can be localized or de-localized depending on the conformation of the molecule while the rotor rotates when activated by an E-field;
(e) The conformation(s) of the molecule can be E-field dependent or bi-stable;
(f) The bi-stable state(s) can be achieved by intra- or inter-molecular forces such as hydrogen bonding, Coulomb force, van der Waals force, metal ion complex or dipole inter-stabilization; and
(g) The band gap of the molecule will change depending on the degree of non-bonding electron, or π-electron, or π-electron and non-bonding electron de-localization of the molecule. This will change the conductivity of the molecule.

Following are two examples of this model (Examples 1 and 2):

The novel molecules of the present invention are active electronic devices that can be switched with an external electric field. The general idea is to design into the molecules a rotatable middle segment (rotor) 32 that has a large dipole moment (see Examples 1 and 2) and that links two other portions of the molecule 30 that are immobilized (stators) 34. Under the influence of an applied electric field, the vector dipole moment of the rotor 32 will attempt to align parallel to the direction of the external field. However, the molecule 30 is designed such that there are inter- and/or intra-molecular forces, such as hydrogen bonding or dipole-dipole interactions as well as steric repulsions, that stabilize the rotor 32 in particular orientations with respect to the stators 34. Thus, a large electric field is required to cause the rotor 32 to unlatch from its initial orientation and rotate with respect to the stators 34, if the direction of the applied field is opposite to that of the dipole of the rotor.

Once switched into a particular orientation, the molecule 30 will remain in that orientation until it is switched out. However, a key component of the molecule design is that there is a steric repulsion that will prevent the rotor 32 from rotating through a complete 180 degree half cycle. Instead, the rotation is halted by the steric interaction of bulky groups on the rotor 32 and stators 34 at an angle of approximately 90 degrees from the initial orientation. Furthermore, this 90 degree orientation is stabilized by a different set of inter- and/or intra-molecular hydrogen bonds or dipole interactions, and is thus latched in place even after the applied field is turned off. For switch molecules, this ability to latch the rotor 32 between two states separated by approximately 90 degrees from the stators is crucial.

When the rotor 32 and stators 34 are all co-planar, the molecule is completely conjugated. Thus, the non-bonding electrons, or π-electrons, or π-electrons and non-bonding electrons of the molecule, through its highest occupied molecular orbital (HOMO) and lowest unoccupied molecular orbital (LUMO), are delocalized over the entire molecule 30. This is a high conductivity (switch ON) state for the molecule. In the case where the rotor 32 is rotated by 90 degrees with respect to the stators 34, the conjugation of the molecule 30 is broken and the HOMO and LUMO are no longer delocalized over the entire molecule. This is the low conductivity or switch OFF state of the molecule 30. Thus, the molecule 30 is reversibly switchable between the ON and OFF states.

Examples 1 and 2 show two different orientations for switching the molecules. In Example 1, the rotation axis of the rotor is designed to be nearly perpendicular to the net current-carrying axis of the molecules, whereas in Example 2, the rotation axis is parallel to the orientation axis of the molecule. These designs allow different geometries of molecular films and electrodes to be used, depending on the desired results. In Example 1, the vertical dotted lines represent electrodes, to which the molecule is attached through an —S— linkage. The direction of the switching field is perpendicular to the electrodes, as shown by the double-headed arrow.

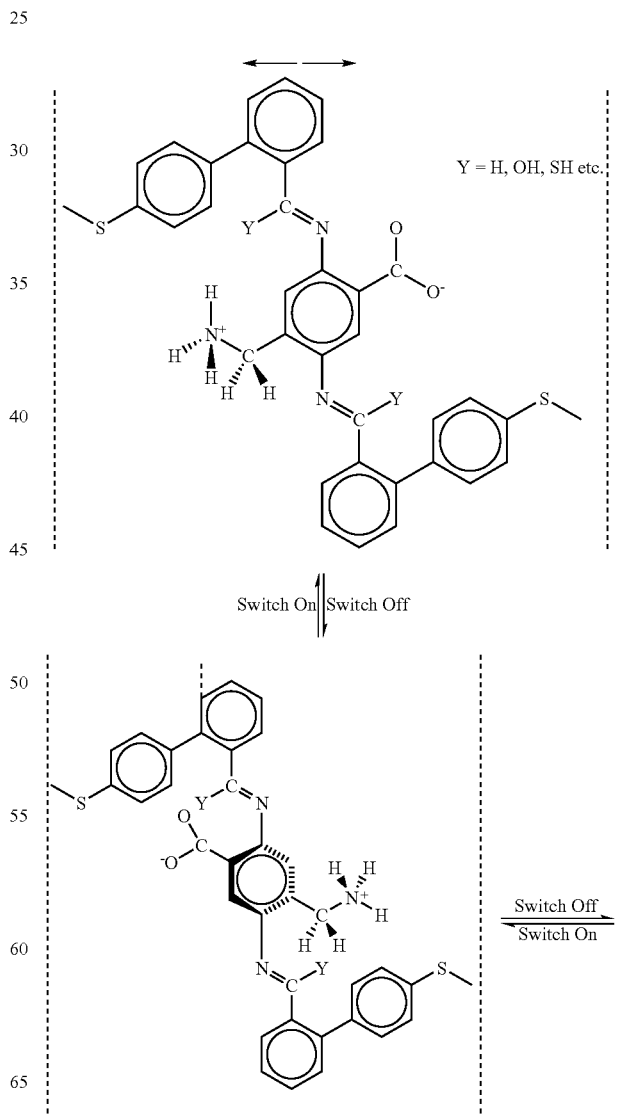

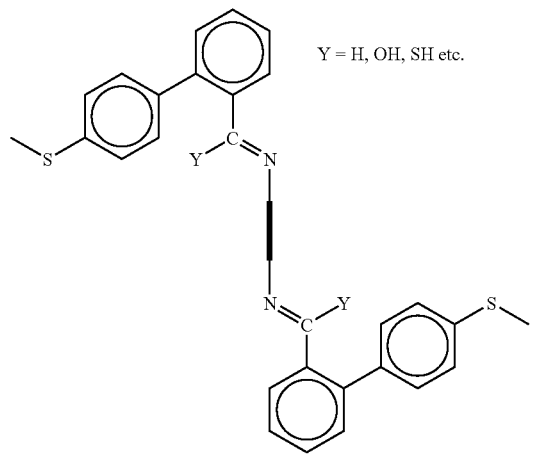

Example 1

The molecule shown above (Example 1) has been designed with the internal rotor 32 perpendicular to the orientation or current-flow axis of the entire molecule 30. In this case, the external field is applied along the orientation axis of the molecule 30 as pictured—the electrodes (vertical dotted lines) are oriented perpendicular to the plane of the paper and perpendicular to the orientation axis of the molecule 30. Application of an electric field oriented from left to right in the diagrams, as indicted by the double-headed arrow, will cause the rotor 32 as pictured in the upper diagram to rotate to the position shown on the lower right diagram, and vice versa. In this case, the rotor 32 as pictured in the lower right diagram is not coplanar with the rest of the molecule, so this is the OFF or low conductivity state of the molecule, whereas the rotor is co-planar with the rest of the molecule on the upper diagram, so this is the ON or high conductivity state of the molecule. The structure shown in the lower left diagram depicts the transition state of rotation between the upper diagram (co-planar, conjugated) and the lower right diagram (central portion rotated, non-conjugated).

The molecule depicted in Example 1 is non-conductive (or comparatively low conductive) in the non-conjugated state. In the conjugated state, the molecule is conductive.

For the molecules in Example 1, a single monolayer molecular film is grown, for example using Langmuir-Blodgett techniques or self-assembled monolayers, such that the orientation axis of the molecules is perpendicular to the plane of the electrodes used to switch the molecules. Electrodes may be deposited in the manner described by Collier et al, supra, or methods described in the above-referenced patent applications and issued patent.

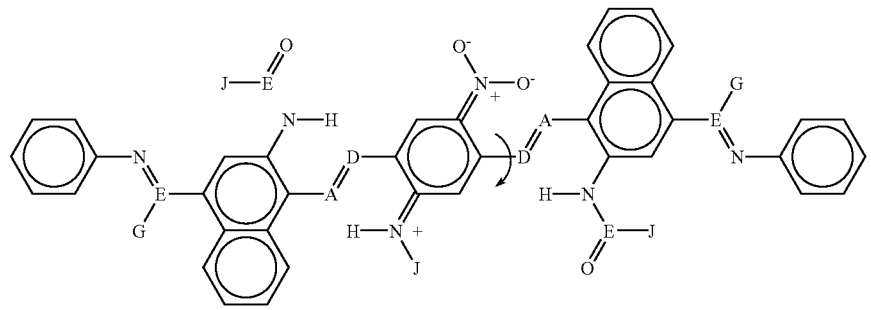

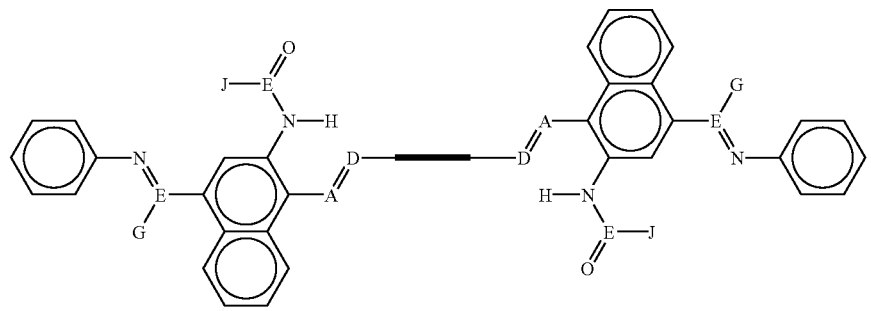

Example 2

The molecule shown above (Example 2) has been designed with the internal rotor parallel to the orientation axis of the entire molecule. In this case, the external field is applied perpendicular to the molecular axis—the electrodes are oriented parallel to the long axis of the molecule and can be either perpendicular or parallel to the plane of the above model structures. For example, application of an electric field to the upper molecule shown above where the field lines are perpendicular to the molecular axis and pointing upward will cause the rotor as pictured in that diagram to rotate to approximately 90 degrees and appear edge on, as shown in the lower molecular diagram above, and vice versa. In this case, the rotor as pictured in the lower diagram is not coplanar with the rest of the molecule, so this is the OFF or low conductivity state of the molecule, whereas the rotor is coplanar with the rest of the molecule on the upper diagram, so this is the ON or high conductivity state of the molecule. In the diagram, the letters A, D, E, G, and J indicate sites where different chemical units can be utilized to adjust the geometrical structure of the molecule, and other chemical groups may also be used as the rotor and stators. (The letters N, H, and O retain their usual meaning.) The letters A, D, E, G, and J can be any of the following: heteroatoms (e.g., N, O, S, P, etc.), hydrocarbon (either saturated or unsaturated), or hydrocarbon with at least one of the above-mentioned heteroatoms. In addition to the foregoing, the letters G and J can be any of the following heteroatoms: hydrogen, F, Cl, Br, I, etc.

For the molecules of Example 2, the films are grown such that the molecular axis is parallel to the plane of the electrodes. This may involve films that are multiple monolayers thick. The molecules form solid-state or liquid crystals in which the large stator groups are locked into position by intermolecular interactions or direct bonding to a support structure, but the rotor is small enough to move within the lattice of the molecules. With the proper orientation of electrodes, this structure can be used to create a gated junction (transistor); i.e., one where a voltage applied to one electrode can control the current that flows between two other electrodes that are bridged by the molecules.

Although linking moieties are not shown in Example 2, such linking moieties, for example, —S—, depicted in Example 1, would be used to connect the molecule between a pair of electrodes, as depicted in Example 1.

Model (2a): E-field Induced Band Gap Change Caused by the Change of Extended Conjugation Via Charge Separation or Recombination Accompanied by Increasing or Decreasing Band Localization:

FIG. 3a is a schematic depiction of this model, which involves an E-field-induced band gap change caused by the change of extended conjugation via charge separation or recombination accompanied by increasing or decreasing band localization. As shown in FIG. 3a, the molecule 130 comprises two portions 132 and 134. The molecule 130 evidences a larger band gap state, with less π-delocalization. Application of an electric field causes charge separation in the molecule 130, resulting in a smaller band gap state, with better π-delocalization. Recombination of the charges returns the molecule 130 to its original state.

The following requirements must be met in this model:
 (a) The molecule must have a modest dielectric constant $\in_r$ and can be easily polarized by an external E-field, with $\in_r$ in the range of 2 to 10 and polarization fields ranging from 0.01 to 10 V/nm;
 (b) At least one segment of the molecule must have non-bonding electrons, or π-electrons, or π-electrons and non-bonding electrons that can be mobilized over the entire molecule or a part of the molecule;
 (c) The molecule can be symmetrical or asymmetrical;
 (d) The inducible dipole(s) of the molecule can be oriented in at least one direction;
 (e) The charges will be separated either partially or completely during E-field induced polarization;
 (f) The states of charge separation or recombination can be E-field dependent or bi-stable, stabilized through inter- or intra-molecular forces such as covalent bond formation, hydrogen bonding, charge attraction, coulomb forces, metal complex, or Lewis acid (base) complex, etc.;
 (g) The process of charge separation or recombination of the molecule can involve or not involve σ- and π-bond breakage or formation; and
 (h) During the charge separation or re-combination process activated by an E-field, the band gap of the molecule will change depending on the degree of the non-bonding electron, or π-electron, or π-electron and non-bonding electron de-localization in the molecule. Both optical and electrical properties of the molecules will be changed accordingly.

One example of an E-field induced band gap change (conductivity) via charge separation or recombination involving bond breaking or bond formation is shown below (Example 3):

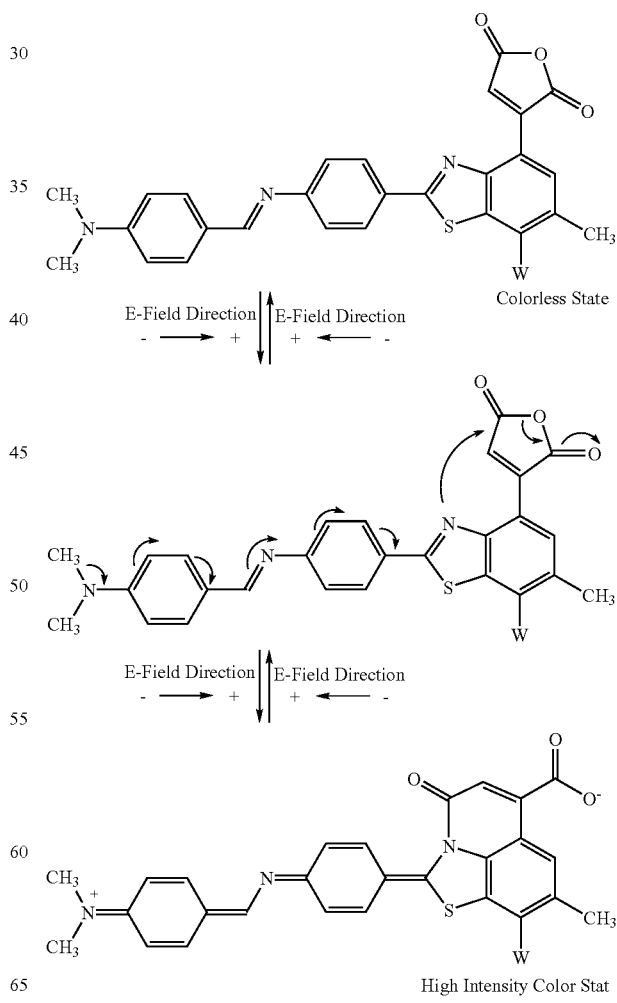

Example 3

The letter W in Example 3 is used to designate an electron-withdrawing group, e.g., nitro, carboxylic acid derivatives, ketone, aldehyde, sulfone, sulfoxide, sulfuric acid or its derivatives, sulfenic acid or its derivatives, halogen or halogenated hydrocarbon, nitrile or nitrile derivatives, or hydrocarbon (saturated or unsaturated) with at least one of the above-mentioned electron-withdrawing groups.

An example of an E-field induced band gap change involving the formation of a molecule-metal complex or a molecule-Lewis acid complex is shown below (Example 4):

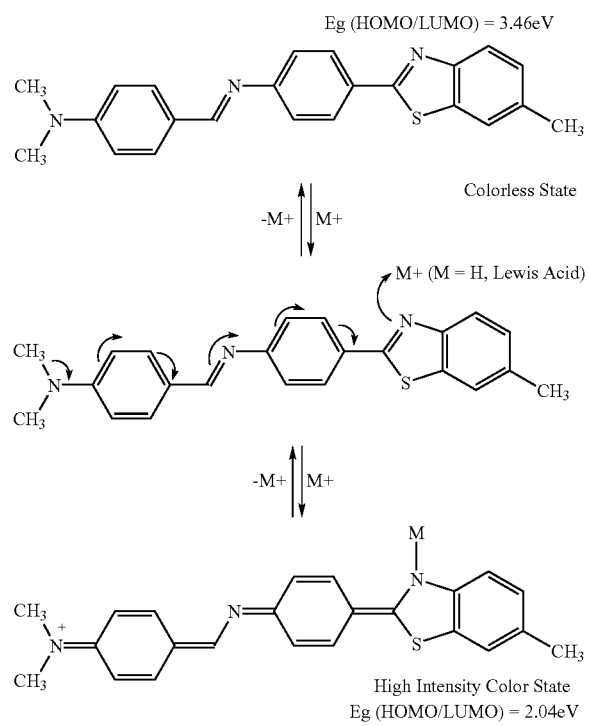

Example 4 where $M^+$ represents metals, including transition metals, or their halogen complexes or $H^+$ or other type of Lewis acid(s).

As above, the pair of electrodes is omitted, as are the linker moieties linking the molecule to the electrodes. However, in practice, such linker moieties and electrodes would be used in an actual device.

Model (2b): E-field Induced Band Gap Change Caused by the Change of Extended Conjugation Via Charge Separation or Recombination and π-Bond Breaking or Formation:

FIG. 3b is a schematic depiction of this model, which involves an E-field-induced band gap change caused by the change of extended conjugation via charge separation or recombination and π-bond breaking or formation. As shown in FIG. 3b, the molecule 130' comprises two portions 132' and 134'. The molecule 130' evidences a smaller band gap state. Application of an electric field causes breaking of the π-bond in the molecule 130', resulting in a larger band gap state. Reversal of the E-field re-connects the π-bond between the two portions 132' and 134' and returns the molecule 130' to its original state.

The requirements that must be met in this model are the same as listed for Model 2(a).

One example of an E-field induced band gap change cause by extended conjugation via charge separation (σ-bond breaking and π-bond formation) is shown below (Example 5):

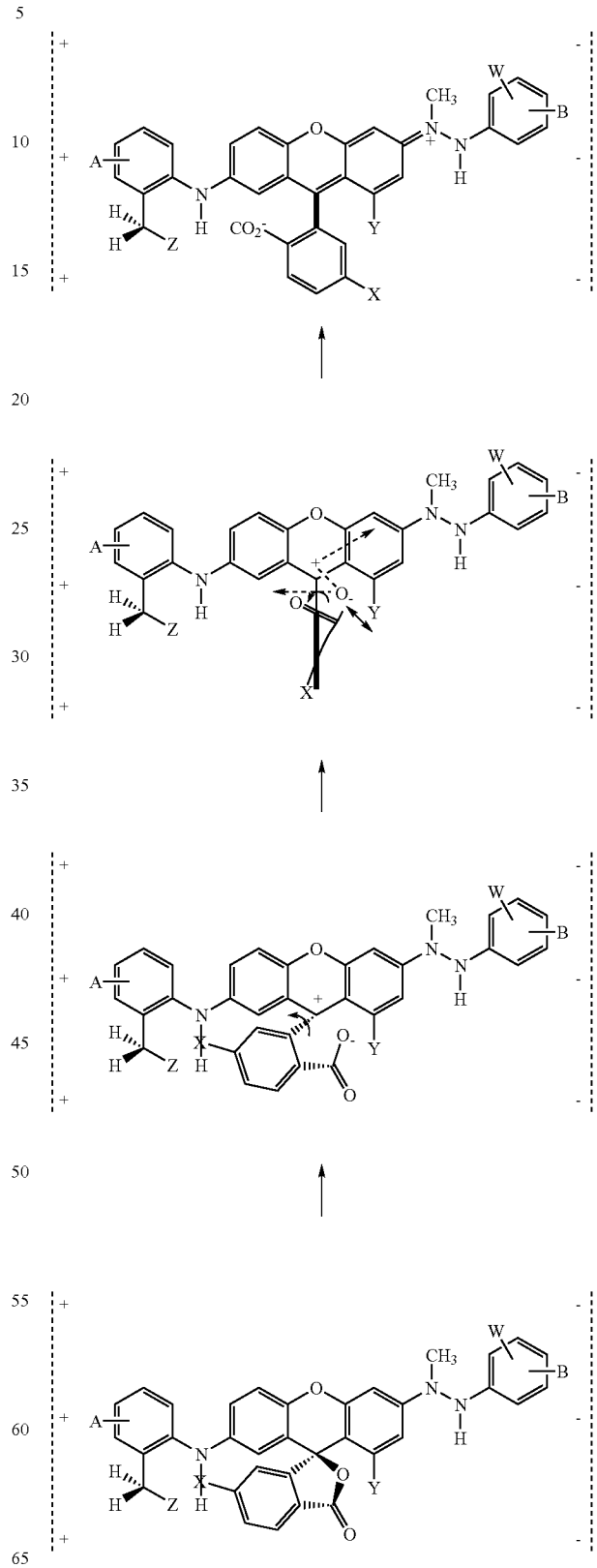

Example 5

In Example 5, the letters A and B can be any of the following: hydrogen, heteroatoms (e.g., N, O, S, P, F, Cl, Br, I, etc.), or functional groups with at least one of the above-mentioned heteroatoms, hydrocarbons (either saturated or unsaturated), or hydrocarbons with at least one of the above-mentioned heteroatoms. The letters W, X, Y, and Z can be any of the following: hydrogen, heteroatoms (e.g., N, O, S, P, B, F, Cl, Br, I, etc.), or functional groups with at least one of the above-mentioned heteroatoms, hydrocarbons (either saturated or unsaturated), or hydrocarbons with at least one of the above-mentioned hetero atoms. The linker moieties, connecting the molecule to the electrodes shown, are not depicted for clarity. However, in an actual device, such linker moieties would be present.

The uppermost molecular structure has a smaller band gap state, and thus a higher conductivity, than the lowermost molecular structure.

Another example of an E-field induced band gap change caused by breakage of extended π-bond conjugation via charge recombination and bond formation is shown below (Example 6):

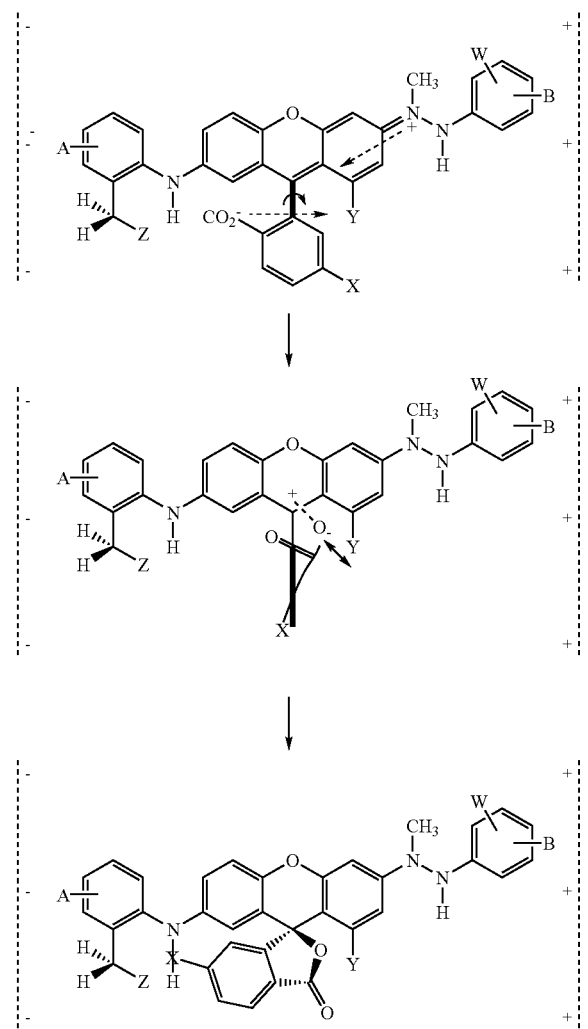

Example 6

In Example 6, the letters A and B can be any of the following: hydrogen, heteroatoms (e.g., N, O, S, P, B, F, Cl, Br, I, etc.), or functional groups with at least one of the above-mentioned heteroatoms, hydrocarbons (either saturated or unsaturated), or hydrocarbons with at least one of the above-mentioned heteroatoms. The letters W, X, Y, and Z can be any of the following: hydrogen, heteroatoms (e.g., N, O, S, P, F, Cl, Br, I, etc.), or functional groups with at least one of the above-mentioned heteroatoms, hydrocarbons (either saturated or unsaturated), or hydrocarbons with at least one of the above-mentioned heteroatoms. Again, the linker moieties have been omitted for convenience.

Again, the uppermost molecular structure has a smaller band gap state, and thus a higher conductivity, than the lowermost molecular structure.

A positive and a negative charge are generated during the C—O bond breaking process. The resulting charges will be separated and move in the direction of the applied external field through charge migration via an extended conjugation system (upper part of the molecule), or bond rotation (lower part of the molecule), and the two aromatic rings with an extended dipole on it (upper part and lower part) of the molecule is completely conjugated and a color (longer wavelength shift) results (see Example 5). However, the molecule is designed to have inter- and/or intra-molecular forces, such as hydrogen bonding, Coulomb, or dipole-dipole interactions as well as steric repulsions, or by a permanent external E-field to stabilize both charges in this particular orientation. Thus, a large field is required to unlatch the molecule from its initial orientation. Once switched into a particular orientation, the molecule will remain in that orientation until it is switched out.

When a reverse E-field is applied (Example 6), both charges tend to realign themselves to the direction of the reverse external field. The positive charge on the upper part of the molecule will migrate to the center part of the molecule (tri-aryl methane position) from the side of the molecule through non-bonding electron, or π-electron, or π-electron and non-bonding electron delocalization. Likewise, the negative charged lower part of the molecule will tend to move closer to the external E-field through C—C bond rotation. A key component of the molecule design is that there is a steric and static repulsion between the $CO_2^-$ and the Y groups that will prevent the lower part of the molecule (the negative charged sector) from rotating through a complete 180 degree half cycle. Instead, the rotation is halted by the steric interaction of bulky groups on the lower part and the upper part at an angle of approximately 90 degrees from the initial orientation. Furthermore, this 90 degree orientation is stabilized by a C—O bond formation and charge recombination. During this process, a tetrahedral carbon (an isolator) is formed at the tri-aryl methane position. The conjugation of the molecule is broken and the HOMO and LUMO are no longer delocalized over the entire upper part of the molecule. This has the effect of shrinking the size of the box, i.e., the volume occupied by the electrons, which causes the HOMO-LUMO gap to increase and the conductivity to decrease.

An important factor is the ability to switch the rotor (lower part of molecule) between two states separated by approximately 90 degrees from the stators (the upper part of the molecule). When the intra-molecular charge separation reaches a maximum distance, then the oppositely charged two aromatic rings of the molecule become completely conjugated. Thus, the p,π-electrons of the molecule, through its highest occupied molecular orbital (HOMO) and lowest unoccupied molecular orbital (LUMO), are delocalized over the entire region. The effect is identical to that for a quantum mechanical particle in a box: when the box is the size of the entire molecule, i.e., when the orbitals are delocalized, then the gap between the HOMO and LUMO is relatively small.

Examples 5 and 6 show two different states of a representative switchable molecule under the influence of an externally applied E-field. For this particular type of molecule, a sufficiently thick molecular film is grown, for example using Langmuir-Blodgett techniques, vapor phase deposition, or electrochemical deposition, such that the orientation axis of the molecules is perpendicular to the plane of the electrodes used to switch the molecules. Another deposition technique is to suspend the molecule as a monomer/oligomer or solvent-based solution that is thick film coated (e.g., reverse roll) or spin-coated onto the substrate and subsequently polymerized (e.g., by UV radiation) or dried while the coating is subjected to an electric field that orients the molecule. A top electrode may be a transparent conductor, such as indium-tin oxide, and the films are grown such that the molecular axis is parallel to the plane of the electrodes. The molecules form solid-state or liquid crystals in which the large stator groups are locked into position by intermolecular interactions or direct bonding to a support structure, but the rotor is small enough to move within the lattice of the molecules.

Model (3): E-field Induced Band Gap Change Via Molecular Folding or Stretching

FIG. 4 is a schematic depiction of this model, which involves an E-field-induced band gap change caused by the change of extended conjugation via molecular folding or stretching. As shown in FIG. 4, the molecule 230 comprises three portions 232, 234, and 236. The molecule 230 evidences a smaller band gap state due to an extended conjugation through the entire molecule. Application of an electric field causes breaking of the conjugation in the molecule 230, due to molecular folding about the central portion 234, resulting in a larger band gap state due to the non-extended conjugation in the entire molecule. Reversal of the E-field unfolds the molecule 230 and returns the molecule to its original state. Stretching and relaxing of the central portion 234 of the molecule 230 has the same effect.

The following requirements must be met in this Model:
(a) The molecule must have at least two segments;
(b) All segments (portions) must have non-bonding electrons, or $\pi$-electrons, or $\pi$-electrons and non-bonding electrons involved in the HOMOs, LUMOs, and nearby orbitals;
(c) The molecule can be either symmetrical or asymmetrical with a donor group on one side and an acceptor group on another side;
(d) At least two segments of the molecule have some functional groups that will help to stabilize both states of folding and stretching through intra- or inter-molecular forces such as hydrogen bonding, van der Waals forces, Coulomb attraction or metal complex formation;
(e) The folding or stretching states of the molecule must be E-field addressable;
(f) In at least one state (presumably in a fully stretched state), the non-bonding electrons, or $\pi$-electrons, or $\pi$-electrons and non-bonding electrons of the molecule will be well-delocalized, and those electrons of the molecule will be localized or only partially delocalized in other state(s);
(g) The band gap of the molecules will change depending on the degree of non-bonding electron, or $\pi$-electron, or $\pi$-electron and non-bonding electron delocalization while the molecule is folded or stretched by an applied external E-field, and this type of change will also affect the conductivity of the molecule as well; and
(h) This characteristic can be applied these types of molecules for optical or electrical switches, gates, storage or display applications.

An example of an E-field induced band gap change via molecular folding or stretching is shown below (Example 7):

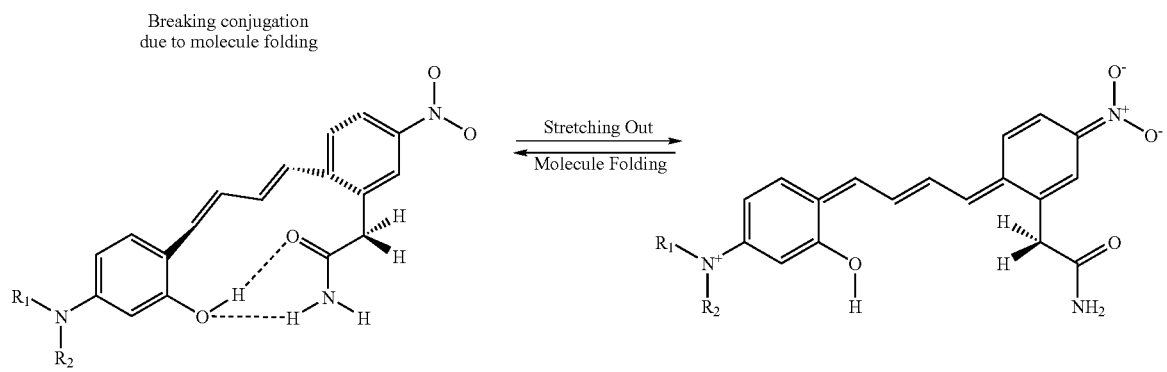

Example 7 where $R_1$ and $R_2$ may be any of the following: hydrogen, heteroatoms (e.g., N, O, S, P, F, Cl, Br, I, etc.), or functional groups with at least one of the above-mentioned heteroatoms, hydrocarbons (either saturated or unsaturated), or hydrocarbons with at least one of the above-mentioned heteroatoms. As above, neither the pair of electrodes nor the linker moieties for connecting the molecule to the electrodes are shown. However, such electrodes and linker moieties would be present in an electronic device.

The molecule on the left hand side has a larger band gap due to the non-extended conjugation in the entire molecule, while the molecule on the right hand side has a smaller band gap and a higher conductivity due to an extended conjugation through the entire molecule.

The technology disclosed and claimed herein for forming crossed wires (micro-meter or nanometer) may be used to perform a variety of functions and to form a variety of useful devices and circuits for implementing computing on a microscale and even on a nanoscale. For example, applications include molecular wire crossbar interconnects (MWCI) for signal routing and communications, molecular wire crossbar memory (U.S. Pat. No. 6,128,214), molecular wire crossbar logic (MWCL) employing programmable logic arrays, a demultiplexer for a molecular wire crossbar network, molecular wire transistors, and pixel arrays for displays.

Figure 5:
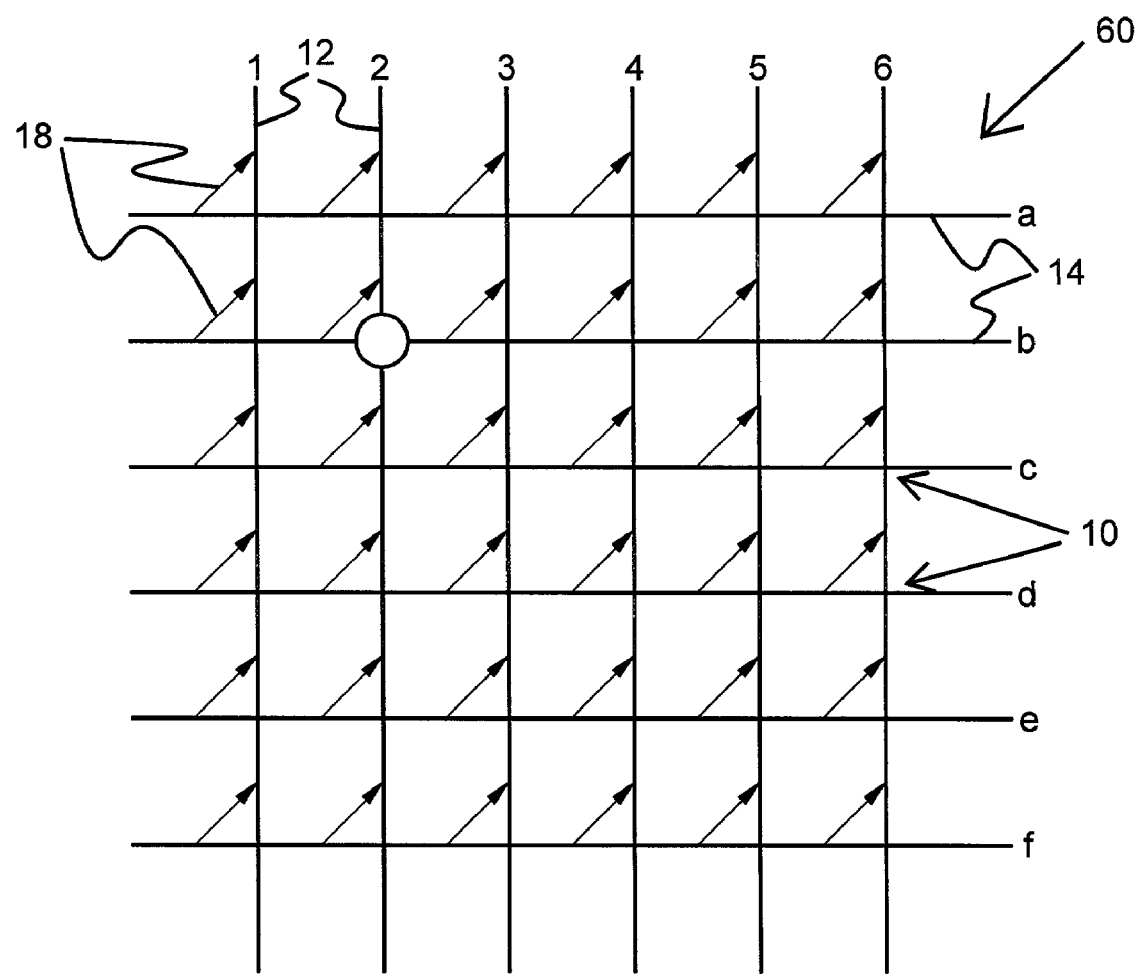
FIG. 5 is a schematic representation of a two-dimensional array of switches of the present invention, depicting a 6×6 crossbar switch.

As illustrated in FIG. 5, the switch 10 of the present invention can be replicated in a two-dimensional array to form a plurality, or array, 60 of switches to form a crossbar switch. FIG. 5 depicts a 6×6 array 60, but the invention is not so limited to the particular number of elements, or switches, in the array. Access to a single point, e.g., 2b, is done by impressing voltage on wires 2 and b to cause a change in the state of the molecular species 18 at the junction thereof, as described above. Thus, access to each junction is readily available for configuring only those pre-selected junctions in accordance with the teachings herein. Details of the operation of the crossbar switch array 60 are further discussed in above-referenced U.S. Pat. No. 6,128,214.

INDUSTRIAL APPLICABILITY

The field-switchable molecules disclosed herein are expected to find use in micro-scale and nano-scale electronic devices.

What is claimed is:

1. An electric field activated molecular switch comprising a molecular system that has an electric field induced non-redox type of band gap change resulting from an intramolecular change in conjugation as p,π-electrons of the molecular system, through its highest occupied molecular orbital (HOMO) and lowest unoccupied molecular orbital (LUMO), are alternately localized and delocalized over the entire molecular system by an applied electric field, wherein said electric field induced band gap change occurs via molecular conformation change or an isomerization, and said molecular system comprises at least one stator portion and at least one rotor portion, wherein said rotor rotates from a first state to a second state with an applied electric field, wherein in said first state, there is extended conjugation throughout said molecular system, resulting in a relatively smaller band gap, and wherein in said second state, said extended conjugation is changed, resulting in a relatively larger band gap.

2. The molecular switch of claim 1 wherein said molecular system comprises:

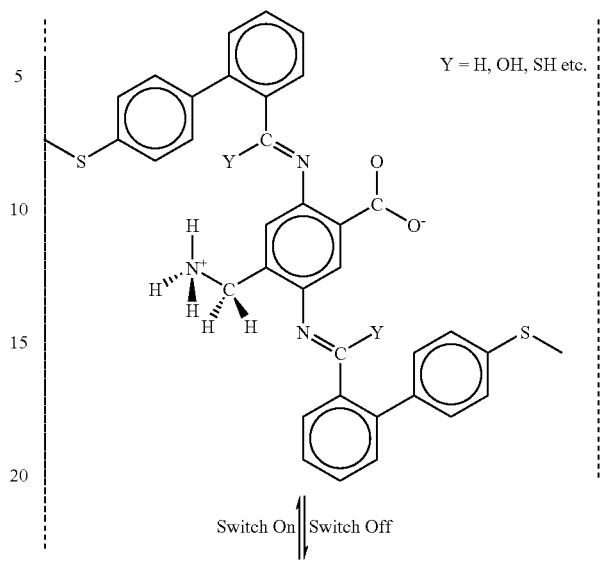

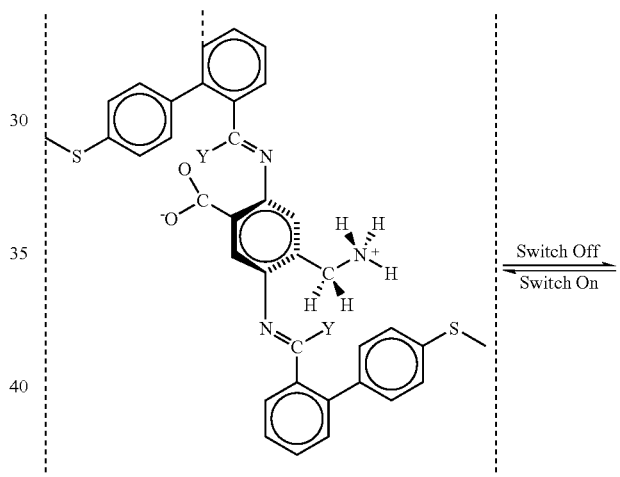

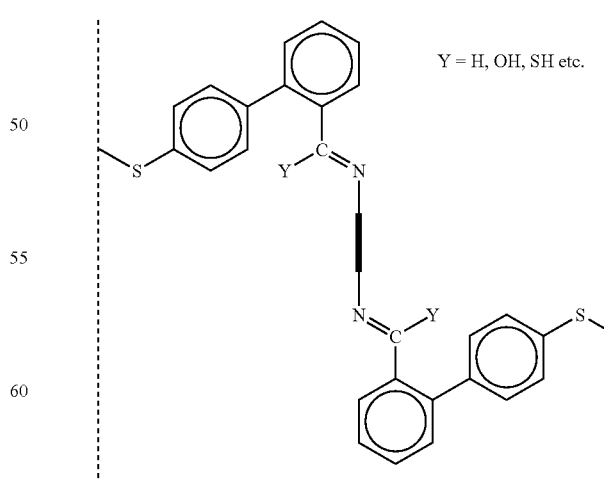

where the vertical dashed lines represent electrodes to which said molecule is electrically attached.

3. The molecular switch of claim 1 wherein said molecular system comprises:

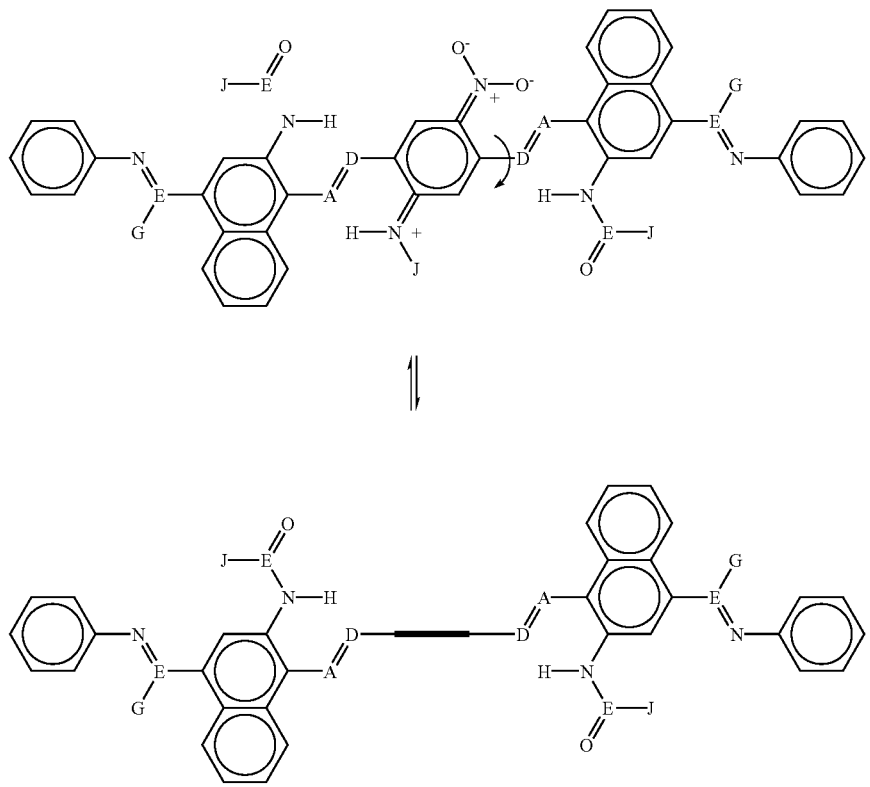

wherein the letters A, D, E, G, and J indicate sites where different chemical units can be utilized to adjust geometrical structure and optical properties of said molecular system and have generic designations as follows: A, D, E, G, and J are independently selected from the group consisting of heteroatoms, hydrocarbons (either saturated or unsaturated), and hydrocarbons with at least one said heteroatom, and where in addition to the foregoing, the letters G and J are independently selected from the group consisting of hydrogen, F, Cl, Br, and I.

4. The molecular switch of claim 1 wherein said molecular system is sandwiched between a pair of electrodes and connected thereto by linking moieties.

5. The molecular switch of claim 1 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

6. The molecular switch of claim 5 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

7. An electric field activated molecular switch comprising a molecular system that has an electric field induced non-redox type of band gap change resulting from an intramolecular change in conjugation as p,π-electrons of the molecular system, through its highest occupied molecular orbital (HOMO) and lowest unoccupied molecular orbital (LUMO), are alternately localized and delocalized over the entire molecular system by an applied electric field, wherein said electric field induced band gap occurs via a change of extended conjugation via chemical bonding change to change the band gap and said molecular system comprises at least one stator portion and at least one rotor portion, wherein said rotor rotates from a first state to a second state with an applied electric field, wherein in said first state, there is extended conjugation throughout said molecular system, resulting in a relatively smaller band gap, and wherein in said second state, said extended conjugation is changed, resulting in a relatively larger band gap.

8. The molecular switch of claim 7 wherein said molecular system is sandwiched between a pair of electrodes and connected thereto by linking moieties.

9. The molecular switch of claim 7 wherein said electric field induced band gap change occurs via a change of extended conjugation via charge separation or recombination accompanied by increasing or decreasing band localization.

10. The molecular switch of claim 9 wherein said molecular system comprises two portions, wherein a change from a first state to a second state occurs with an applied electric field, said change involving charge separation in changing from said first state to said second state, thereby resulting in a relatively larger band gap state, with less π-delocalization, and recombination of charge in changing from said second state to said first state, thereby resulting in a relatively smaller band gap state, with greater π-delocalization.

11. The molecular switch of claim 10 wherein said molecular system comprises:

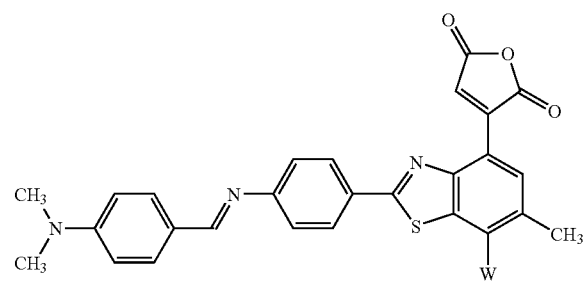

Colorless State

E-Field Direction — → +   E-Field Direction + ← —

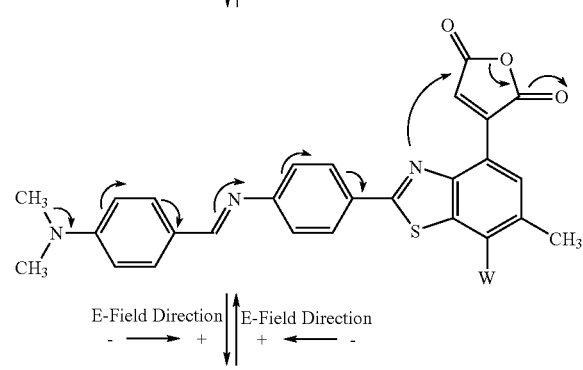

E-Field Direction — → +   E-Field Direction + ← —

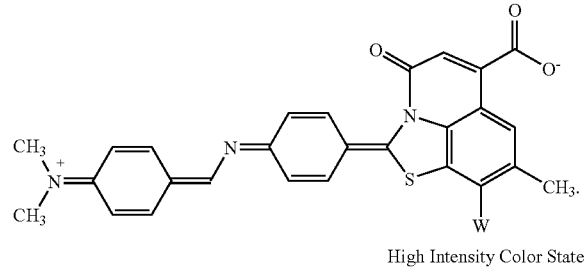

High Intensity Color State

12. The molecular switch of claim 10 wherein said molecular system comprises:

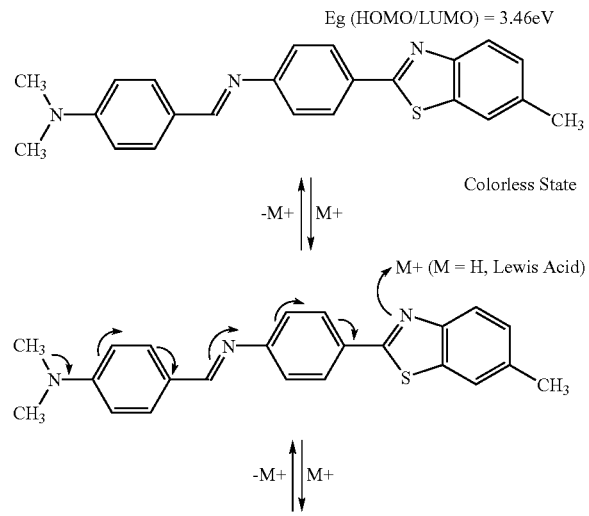

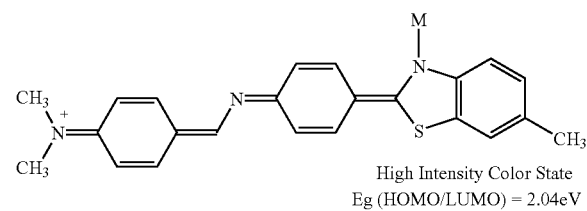

High Intensity Color State
Eg (HOMO/LUMO) = 2.04eV where $M^+$ represents metals, including transition metals, or their halogen complexes or $H^+$ or other type of Lewis acid(s).

13. The molecular switch of claim 7 wherein said electric field induced band gap occurs via a change of extended conjugation via charge separation or recombination and π-bond breaking or formation.

14. The molecular switch of claim 13 wherein said molecular system comprises two portions, wherein a change from a first state to a second state occurs with an applied electric field, said change involving charge separation in changing from said first state to said second state, wherein in said first state, there is extended conjugation throughout said molecular system, resulting in a relatively larger band gap state, and wherein in said second state, said extended conjugation is changed and separated positive and negative charges are created within said molecular system, resulting in a relatively smaller band gap state.

15. The molecular switch of claim 14 wherein said molecular system comprises:

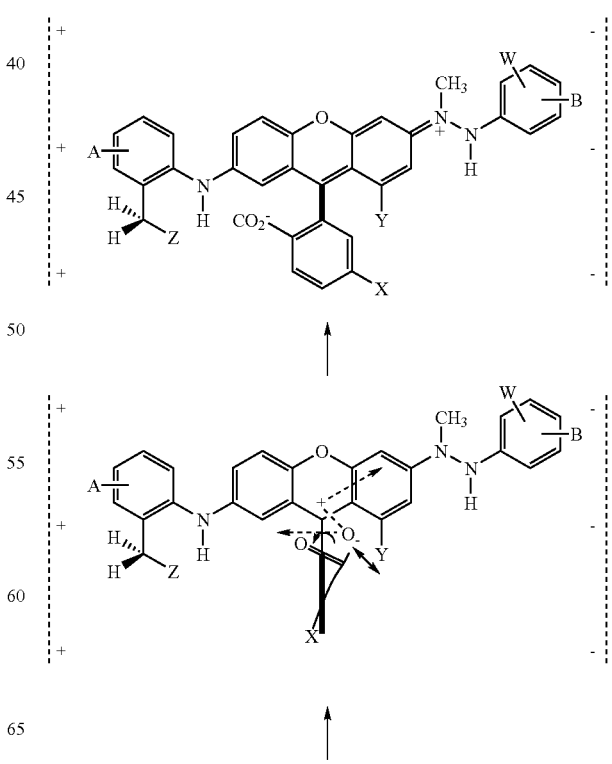

-continued

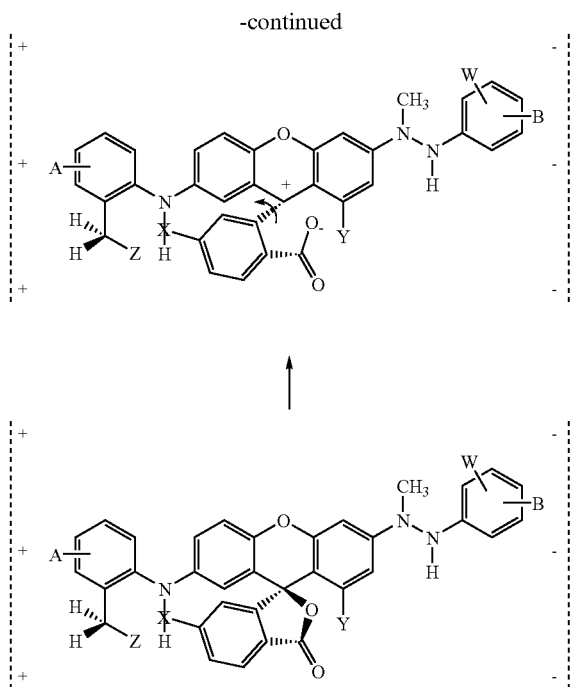

wherein A, B, W, X, Y, and Z are independently selected from the group consisting of hydrogen, heteroatoms, functional groups with at least one said heteroatom, hydrocarbons (either saturated or unsaturated), and hydrocarbons with at least one said heteroatom and the vertical dashed lines represent electrodes with which said molecular system is electrically associated.

16. The molecular switch of claim 14 wherein said molecular system comprises:

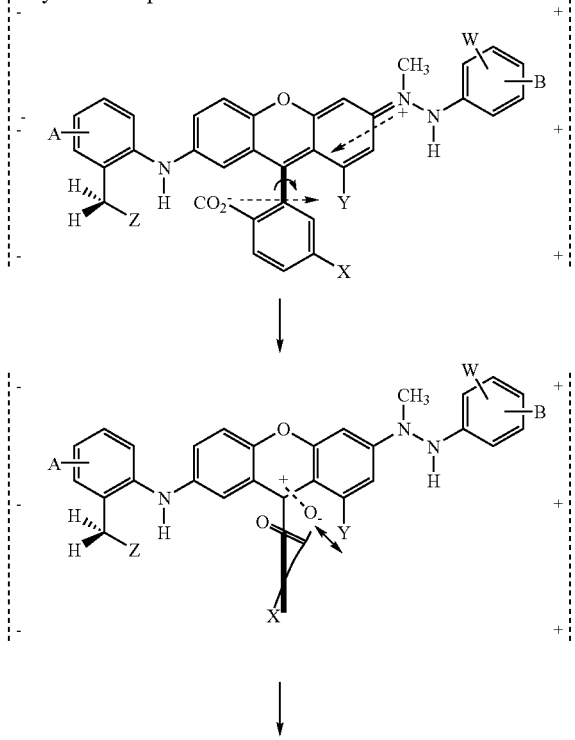

-continued

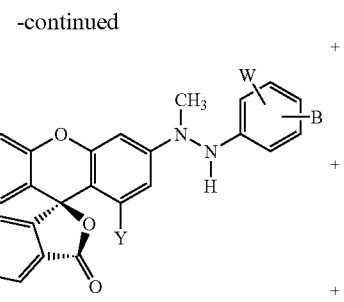

wherein A, B, W, X, Y, and Z are independently selected from the group consisting of hydrogen, heteroatoms, functional groups with at least one said heteroatom, hydrocarbons (either saturated or unsaturated), and hydrocarbons with at least one said heteroatom and the vertical dashed lines represent electrodes with which said molecular system is electrically associated.

17. The molecular switch of claim 7 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

18. The molecular switch of claim 17 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

19. An electric field activated molecular switch comprising a molecular system that has an electric field induced non-redox type of band gap change resulting from an intramolecular change in conjugation as p,π-electrons of the molecular system, through its highest occupied molecular orbital (HOMO) and lowest unoccupied molecular orbital (LUMO), are alternately localized and delocalized over the entire molecular system by an applied electric field, wherein said electric field induced band gap change occurs via molecular folding or stretching.

20. The molecular switch of claim 19 wherein said molecular system is sandwiched between a pair of electrodes and connected thereto by linking moieties.

21. The molecular switch of claim 19 wherein said molecular system comprises three portions, a first portion and a third portion, each bonded to a second, central portion, wherein a change from a first state to a second state occurs with an applied electric field, said change involving a folding or stretching about or of said second portion, wherein in said first state, there is extended conjugation throughout said molecular system, resulting in a relatively smaller band gap state, and wherein in said second state, said extended conjugation is changed, resulting in a relatively larger band gap.

22. The molecular switch of claim 21 wherein said molecular system comprises:

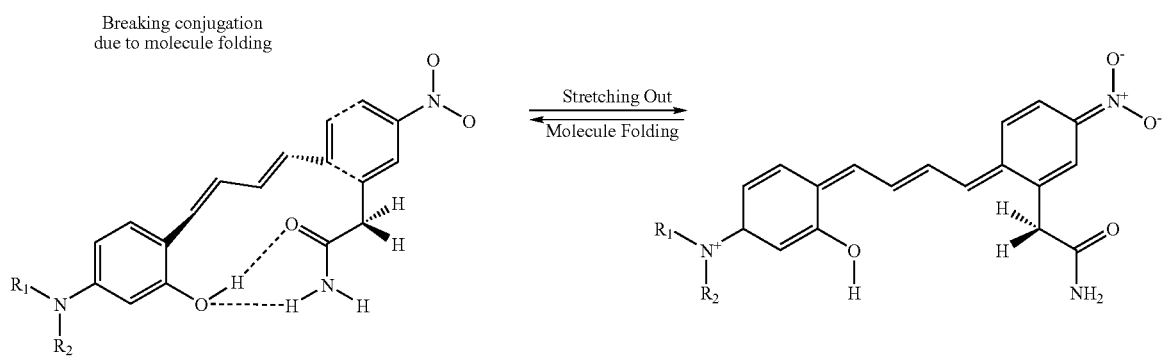

wherein $R_1$ and $R_2$ are independently selected from the group consisting of hydrogen, heteroatoms, functional groups with at least one said heteroatom, hydrocarbons (either saturated or unsaturated), and hydrocarbons with at least one said heteroatom.

23. The molecular switch of claim 19 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

24. The molecular switch of claim 23 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

25. A method of electrically switching between two different states in an electric field activated molecular switch comprising a crossed-wire device comprising at least one pair of crossed wires that form a junction where one wire crosses another at an angle other than zero degrees and at least one connector species connecting the pair of crossed wires in the junction, wherein the junction has a functional dimension in nanometers and wherein the connector species comprises a molecular system that has an electric field induced non-redox type of band gap change resulting from an intramolecular change in conjugation as p,π-electrons of the molecular system, through its highest occupied molecular orbital (HOMO) and lowest unoccupied molecular orbital (LUMO), are alternately localized and delocalized over the entire molecular system by the electric field, wherein said electric field induced band gap change occurs via molecular conformation change or an isomerization, and said molecular system comprises at least one stator portion and at least one rotor portion, wherein said rotor rotates from a first state to a second state with an applied electric field, wherein in said first state, there is extended conjugation throughout said molecular system, resulting in a relatively smaller band gap, and wherein in said second state, said extended conjugation is changed, resulting in a relatively larger band gap.

26. The method of claim 25 wherein said molecular system comprises:

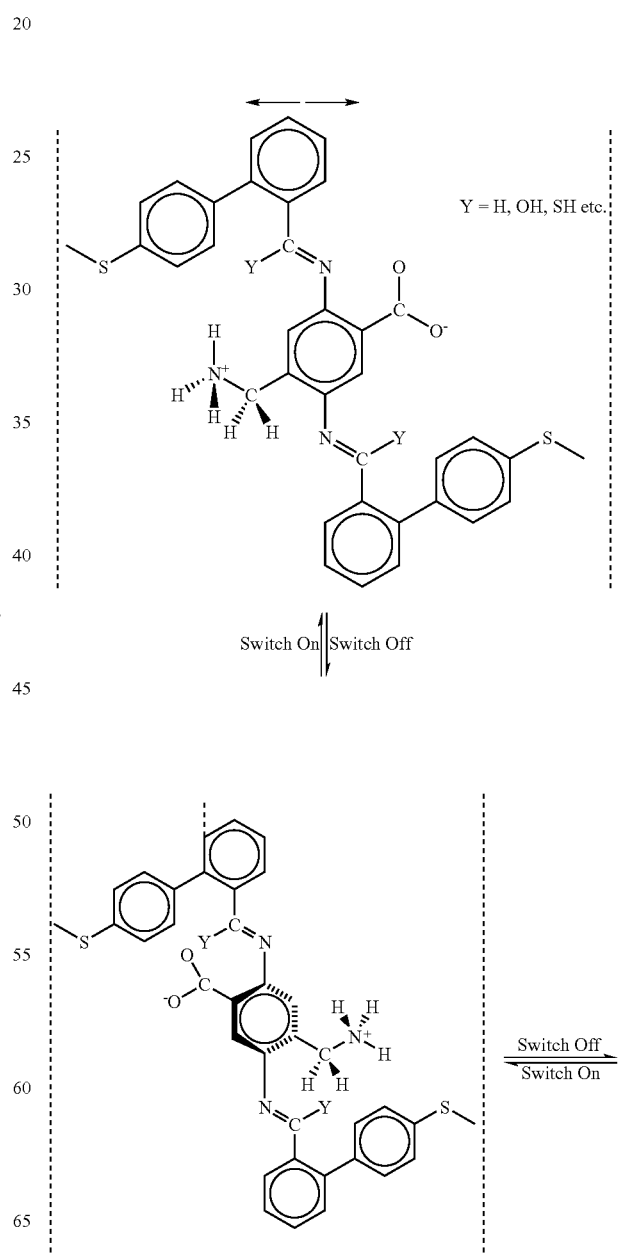

-continued

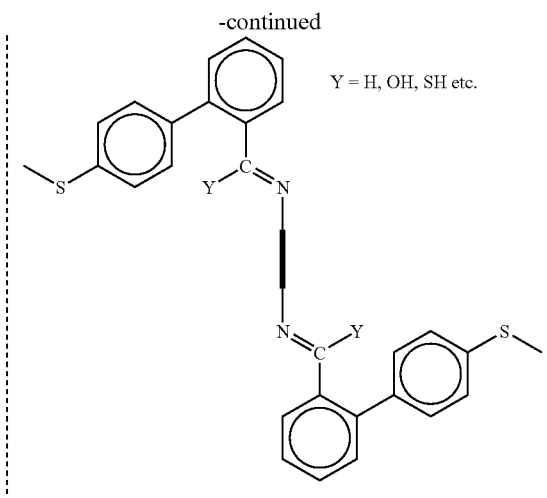

Y = H, OH, SH etc.

where the vertical dashed lines represent electrodes to which said molecule is electrically attached.

27. The method of claim 25 wherein said molecular system comprises:

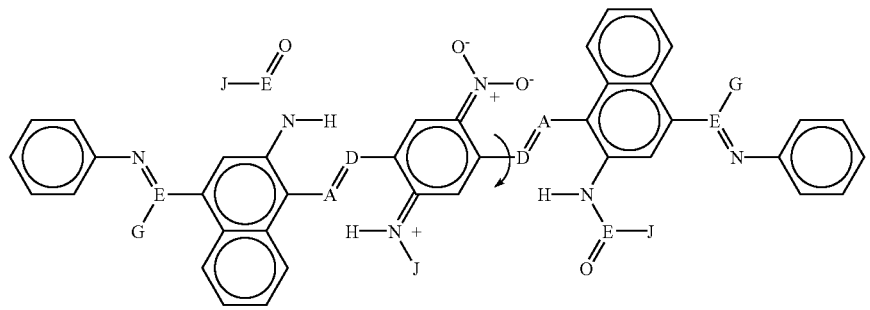

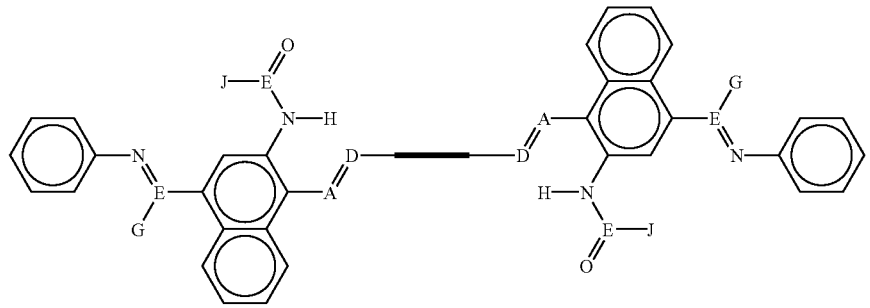

wherein the letters A, D, E, G, and J indicate sites where different chemical units can be utilized to adjust geometrical structure and optical properties of said molecular system and have generic designations as follows: A, D, E, G, and J are independently selected from the group consisting of heteroatoms, hydrocarbons (either saturated or unsaturated), and hydrocarbons with at least one said heteroatom, and where in addition to the foregoing, the letters G and J are independently selected from the group consisting of hydrogen, F, Cl, Br, and I.

28. The method of claim 25 wherein said molecular system is sandwiched between a pair of electrodes and connected thereto by linking moieties.

29. The method of claim 25 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

30. The method of claim 29 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

31. A method of electrically switching between two different states in an electric field activated molecular switch comprising a crossed-wire device comprising at least one pair of crossed wires that form a junction where one wire crosses another at an angle other than zero degrees and at least one connector species connecting the pair of crossed wires in the junction, wherein the junction has a functional dimension in nanometers and wherein the connector species comprises a molecular system that has an electric field induced non-redox type of band gap change resulting from an intramolecular change in conjugation as p,π-electrons of the molecular system, through its highest occupied molecular orbital (HOMO) and lowest unoccupied molecular orbital (LUMO), are alternately localized and delocalized aver the entire molecular system by the electric field, wherein said electric field induced band gap occurs via a change of extended conjugation via chemical bonding change to change the band gap.

32. The method of claim 31 wherein said molecular system is sandwiched between a pair of electrodes and connected thereto by linking moieties.

33. The method of claim 31 wherein said electric field induced band gap change occurs via a change of extended conjugation via charge separation or recombination accompanied by increasing or decreasing band localization.

34. The method of claim 33 wherein said molecular system comprises two portions, wherein a change from a first state to a second state occurs with an applied electric field, said change involving charge separation in changing from said first state to said second state, thereby resulting in a relatively larger band gap state, with less π-delocalization, and recombination of charge in changing from said second state to said first state, thereby resulting in a relatively smaller band gap state, with greater π-delocalization.

35. The method of claim 34 wherein said molecular system comprises:

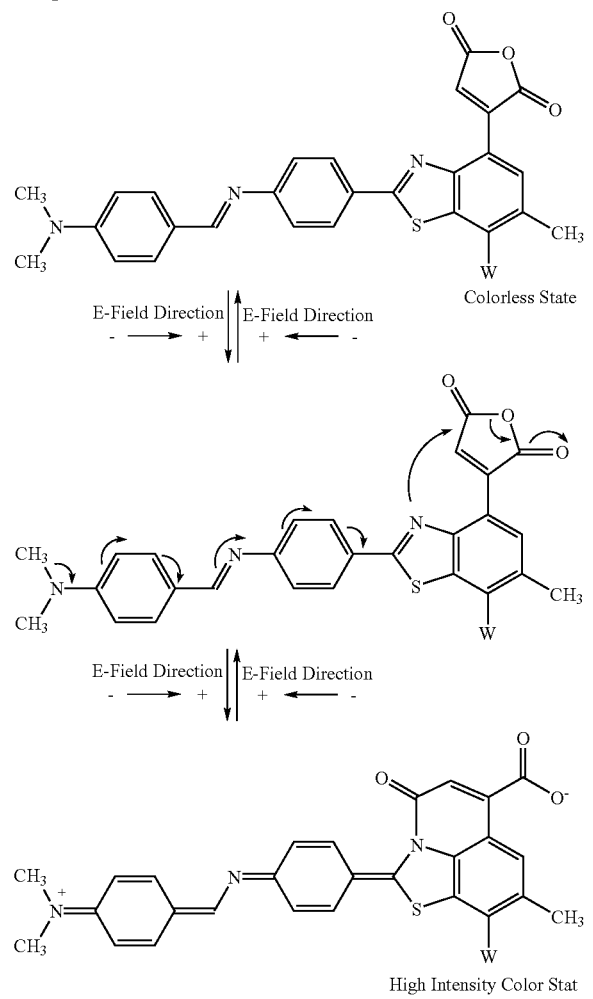

36. The method of claim 34 wherein said molecular system comprises:

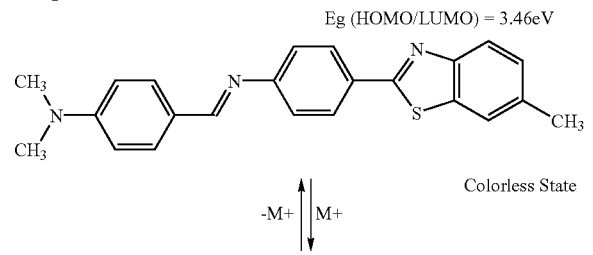

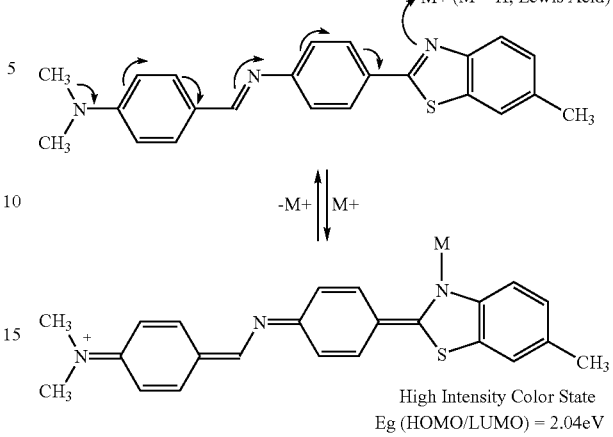

where M⁺ represents metals, including transition metals, or their halogen complexes or H⁺ or other type of Lewis acid(s).

37. The method of claim 31 wherein said electric field induced band gap occurs via a change of extended conjugation via charge separation or recombination and π-bond breaking or formation.

38. The method of claim 37 wherein said molecular system comprises two portions, wherein a change from a first state to a second state occurs with an applied electric field, said change involving charge separation in changing from said first state to said second state, wherein in said first state, there is extended conjugation throughout said molecular system, resulting in a relatively larger band gap state, and wherein in said second state, said extended conjugation is changed and separated positive and negative charges are created within said molecular system, resulting in a relatively smaller band gap state.

39. The method of claim 38 wherein said molecular system comprises:

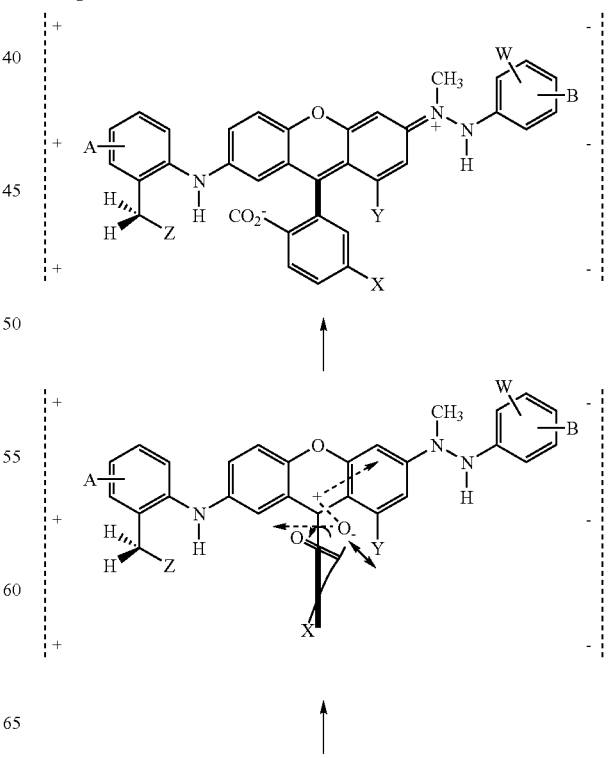

-continued

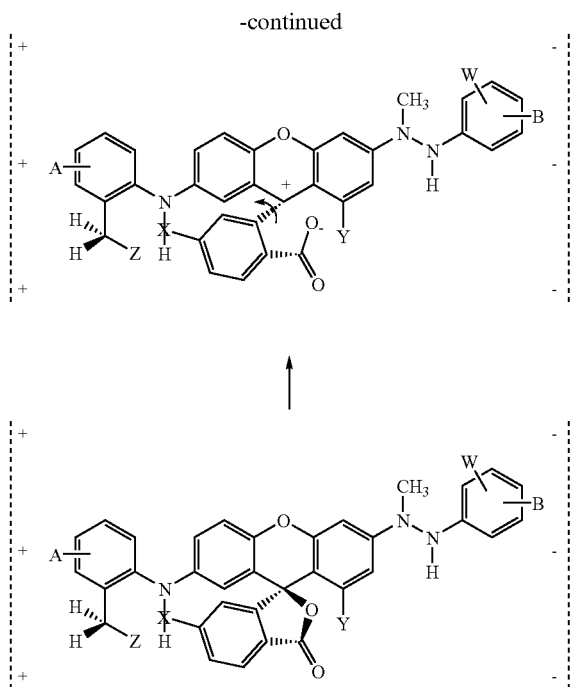

wherein A, B, W, X, Y, and Z are independently selected from the group consisting of hydrogen, heteroatoms, functional groups with at least one said heteroatom, hydrocarbons (either saturated or unsaturated), and hydrocarbons with at least one said heteroatom and the vertical dashed lines represent electrodes with which said molecular system is electrically associated.

40. The method of claim 38 wherein said molecular system comprises:

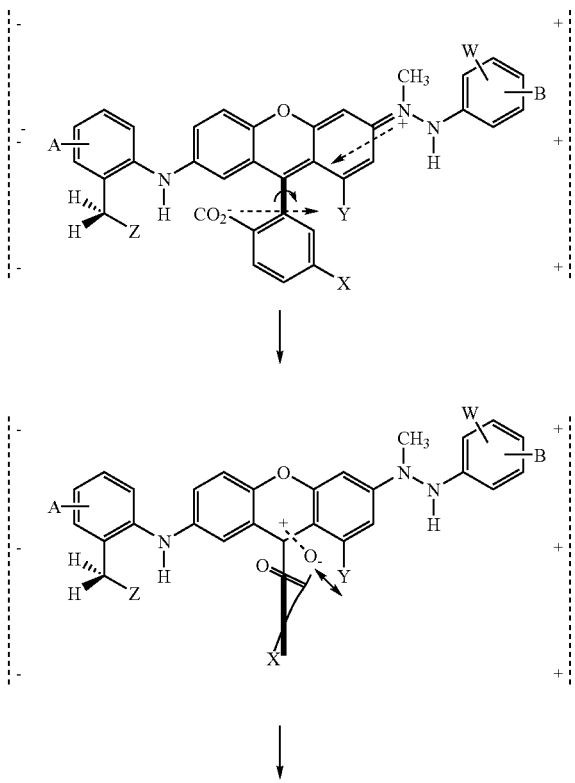

-continued

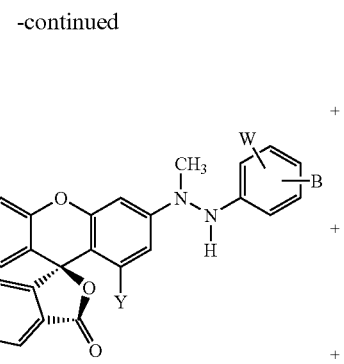

wherein A, B, W, X, Y, and Z are independently selected from the group consisting of hydrogen, heteroatoms, functional groups with at least one said heteroatom, hydrocarbons (either saturated or unsaturated), and hydrocarbons with at least one said heteroatom and the vertical dashed lines represent electrodes with which said molecular system is electrically associated.

41. The method of claim 31 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

42. The method of claim 41 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

43. A method of electrically switching between two different states in an electric field activated molecular switch comprising a crossed-wire device comprising at least one pair of crossed wires that form a junction where one wire crosses another at an angle other than zero degrees and at least one connector species connecting the pair of crossed wires in the junction, wherein the junction has a functional dimension in nanometers and wherein the connector species comprises a molecular system that has an electric field induced non-redox type of band gap change resulting from an intramolecular change in conjugation as p,π-electrons of the molecular system, through its highest occupied molecular orbital (HOMO) and lowest unoccupied molecular orbital (LUMO), are alternately localized and delocalized over the entire molecular system by the electric field, wherein said electric field induced band gap change occurs via molecular folding or stretching.

44. The method of claim 43 wherein said molecular system comprises three portions, a first portion and a third portion, each bonded to a second, central portion, wherein a change from a first state to a second state occurs with an applied electric field, said change involving a folding or stretching about or of said second portion, wherein in said first state, there is extended conjugation throughout said molecular system, resulting in a relatively smaller band gap state, and wherein in said second state, said extended conjugation is changed, resulting in a relatively larger band gap.

45. The method of claim 44 wherein said molecular system comprises:

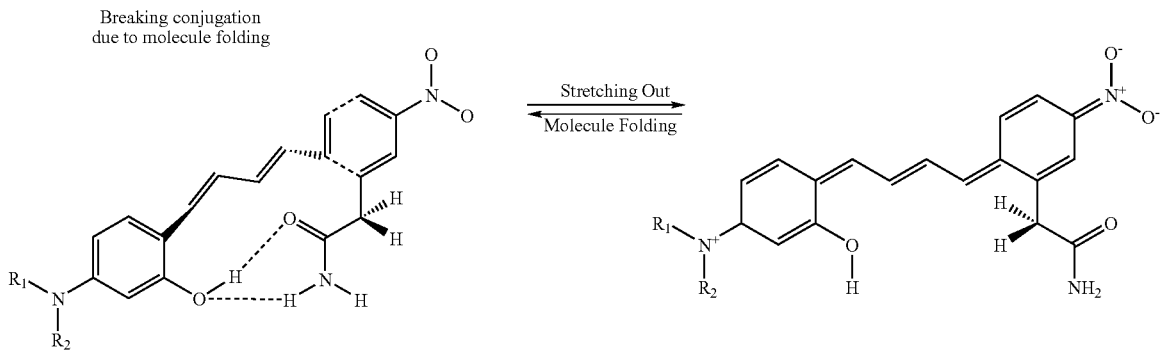

wherein $R_1$ and $R_2$ are independently selected from the group consisting of hydrogen, heteroatoms, functional groups with at least one said heteroatom, hydrocarbons (either saturated or unsaturated), and hydrocarbons with at least one said heteroatom.

46. The method of claim 43 wherein said molecular system is sandwiched between a pair of electrodes and connected thereto by linking moieties.

47. The method of claim 43 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

48. The method of claim 47 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

* * * * *

UNITED STATES PATENT AND TRADEMARK OFFICE
CERTIFICATE OF CORRECTION

PATENT NO. : 7,714,438 B2  Page 1 of 3
APPLICATION NO. : 09/823195
DATED : May 11, 2010
INVENTOR(S) : Xiao-An Zhang et al.

It is certified that error appears in the above-identified patent and that said Letters Patent is hereby corrected as shown below:

Title page, Item (54), and in column 1, line 3, Title, delete "ELECTRICAL" and insert -- ELECTRIC --, therefor.

In column 9, line 2, delete "destroyed," and insert -- changed, --, therefor.

In column 30, lines 5-15, in Claim 22, delete

" 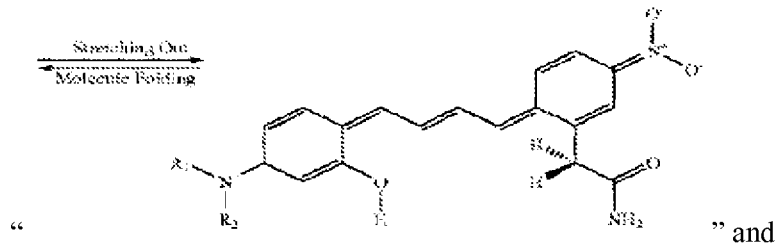 " and insert -- 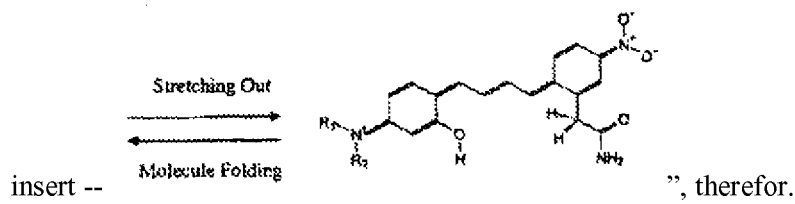 ", therefor.

Signed and Sealed this
Second Day of October, 2012

David J. Kappos
*Director of the United States Patent and Trademark Office*

CERTIFICATE OF CORRECTION (continued)
U.S. Pat. No. 7,714,438 B2

In column 30, lines 23-45, in Claim 26, delete

" 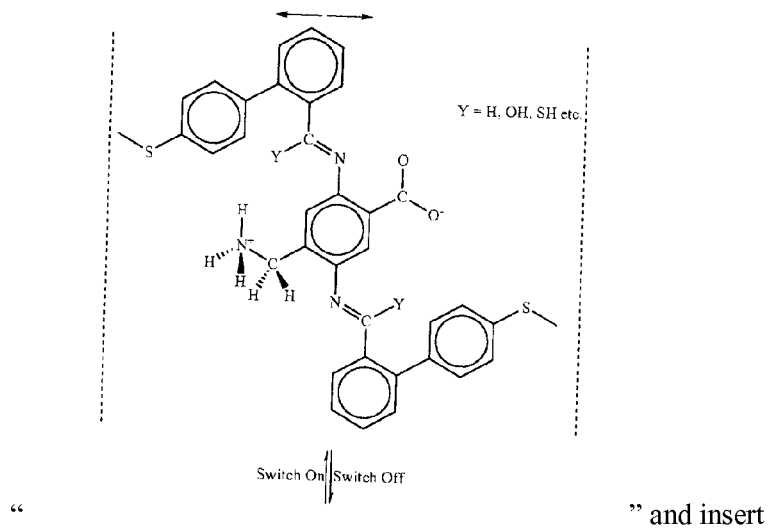 " and insert

-- 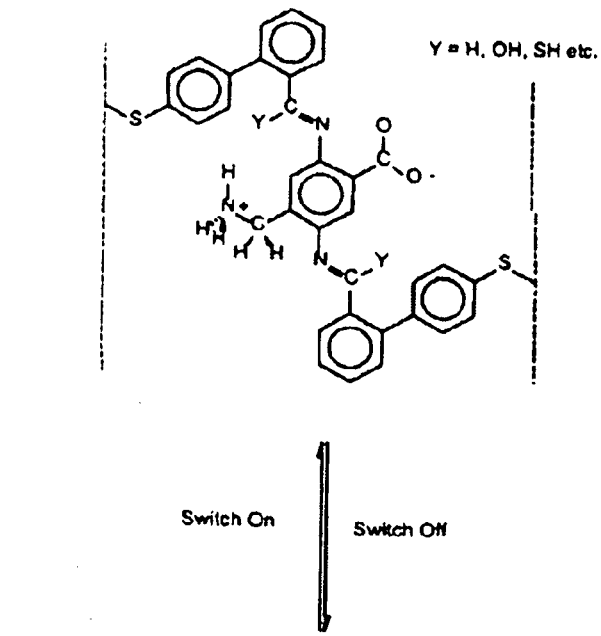 --, therefor.

In column 32, line 1, in Claim 28, delete "claim 25" and insert -- claim 1 --, therefor.

In column 32, line 61, in Claim 31, delete "aver" and insert -- over --, therefor.

In column 33, line 12, in Claim 34, delete "stale," and insert -- state, --, therefor.

In column 33, line 54, in Claim 35, delete "Stat" and insert -- State. --, therefor.

CERTIFICATE OF CORRECTION (continued)
U.S. Pat. No. 7,714,438 B2

In column 38, lines 3-15, in Claim 45, delete " 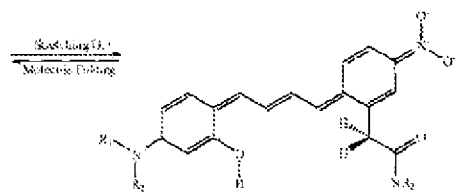 " and insert -- 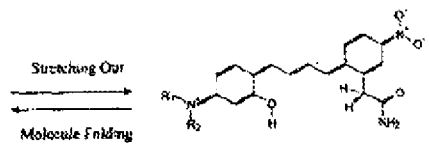 --, therefor.